(12) United States Patent
Asami

(10) Patent No.: US 8,252,643 B2
(45) Date of Patent: Aug. 28, 2012

(54) SEMICONDUCTOR DEVICE AND MANUFACTURING METHOD THEREOF

(75) Inventor: Yoshinobu Asami, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/163,927

(22) Filed: Jun. 20, 2011

(65) Prior Publication Data

US 2011/0263087 A1 Oct. 27, 2011

Related U.S. Application Data

(62) Division of application No. 11/643,195, filed on Dec. 20, 2006, now Pat. No. 7,968,932.

(30) Foreign Application Priority Data

Dec. 26, 2005 (JP) ................................. 2005-373010

(51) Int. Cl.
*H01L 21/28* (2006.01)
*H01L 29/788* (2006.01)

(52) U.S. Cl. .......... 438/257; 257/E21.209; 257/E29.302

(58) Field of Classification Search ................. 257/315, 257/E21.209, E29.302; 438/157, 257
See application file for complete search history.

(56) References Cited

U.S. PATENT DOCUMENTS

| | | | |
|---|---|---|---|
| 5,120,673 A | 6/1992 | Itoh | |
| 5,138,573 A | 8/1992 | Jeuch | |
| 5,349,228 A | 9/1994 | Neudeck et al. | |
| 5,621,236 A | 4/1997 | Choi et al. | |
| 5,798,550 A | 8/1998 | Kuroyanagi et al. | |
| 5,989,960 A | 11/1999 | Fukase | |
| 6,005,270 A | 12/1999 | Noguchi | |
| 6,221,716 B1 * | 4/2001 | Lee et al. .................. | 438/257 |
| 6,236,081 B1 | 5/2001 | Fukumoto | |
| 6,268,842 B1 | 7/2001 | Yamazaki et al. | |

(Continued)

FOREIGN PATENT DOCUMENTS

JP 63-318164 12/1988

(Continued)

OTHER PUBLICATIONS

Office Action re Chinese application No. CN 200610167595.5, dated Oct. 9, 2009 (with English translation).

*Primary Examiner* — Julio J Maldonado
*Assistant Examiner* — Daniel Shook
(74) *Attorney, Agent, or Firm* — Husch Blackwell LLP

(57) ABSTRACT

A semiconductor device which is formed in a self-aligned manner without causing a problem of misalignment in forming a control gate electrode and in which a leak between the control gate electrode and a floating gate electrode is not generated, and a manufacturing method of the semiconductor device are provided. A semiconductor device includes a semiconductor film, a first gate insulating film over the semiconductor film, a floating gate electrode over the first gate insulating film, a second gate insulating film which covers the floating gate electrode, and a control gate electrode over the second gate insulating film. The control gate electrode is formed so as to cover the floating gate electrode with the second gate insulating film interposed therebetween, the control gate electrode is provided with a sidewall, and the sidewall is formed on a stepped portion of the control gate electrode, generated due to the floating gate electrode.

18 Claims, 23 Drawing Sheets

U.S. PATENT DOCUMENTS

| | | |
|---|---|---|
| 6,436,767 B1 | 8/2002 | Koishikawa |
| 6,501,122 B1 | 12/2002 | Chan et al. |
| 6,556,475 B2 | 4/2003 | Yamazaki et al. |
| 6,621,130 B2 | 9/2003 | Kurokawa et al. |
| 6,646,922 B2 | 11/2003 | Kato |
| 6,773,996 B2 | 8/2004 | Suzawa et al. |
| 6,914,818 B2 | 7/2005 | Yamazaki et al. |
| 6,947,327 B2 | 9/2005 | Kato |
| 2002/0047568 A1 | 4/2002 | Koyama |
| 2004/0012550 A1 | 1/2004 | Koyama |
| 2004/0036094 A1 | 2/2004 | Kurokawa et al. |
| 2004/0038482 A1 | 2/2004 | Mokhlesi et al. |
| 2004/0063256 A1 | 4/2004 | Ishikawa |
| 2004/0075092 A1 | 4/2004 | Arao |
| 2004/0124477 A1 | 7/2004 | Minami et al. |
| 2005/0098825 A1 | 5/2005 | Rudeck et al. |
| 2005/0185462 A1 | 8/2005 | Yamazaki et al. |
| 2005/0277253 A1 | 12/2005 | Kato et al. |
| 2005/0281126 A1 | 12/2005 | Kato |
| 2006/0197088 A1 | 9/2006 | Isobe et al. |
| 2007/0228452 A1 | 10/2007 | Asami |

FOREIGN PATENT DOCUMENTS

| | | |
|---|---|---|
| JP | 2-72671 | 3/1990 |
| JP | 5-82787 | 4/1993 |
| JP | 11-87545 | 3/1999 |

\* cited by examiner

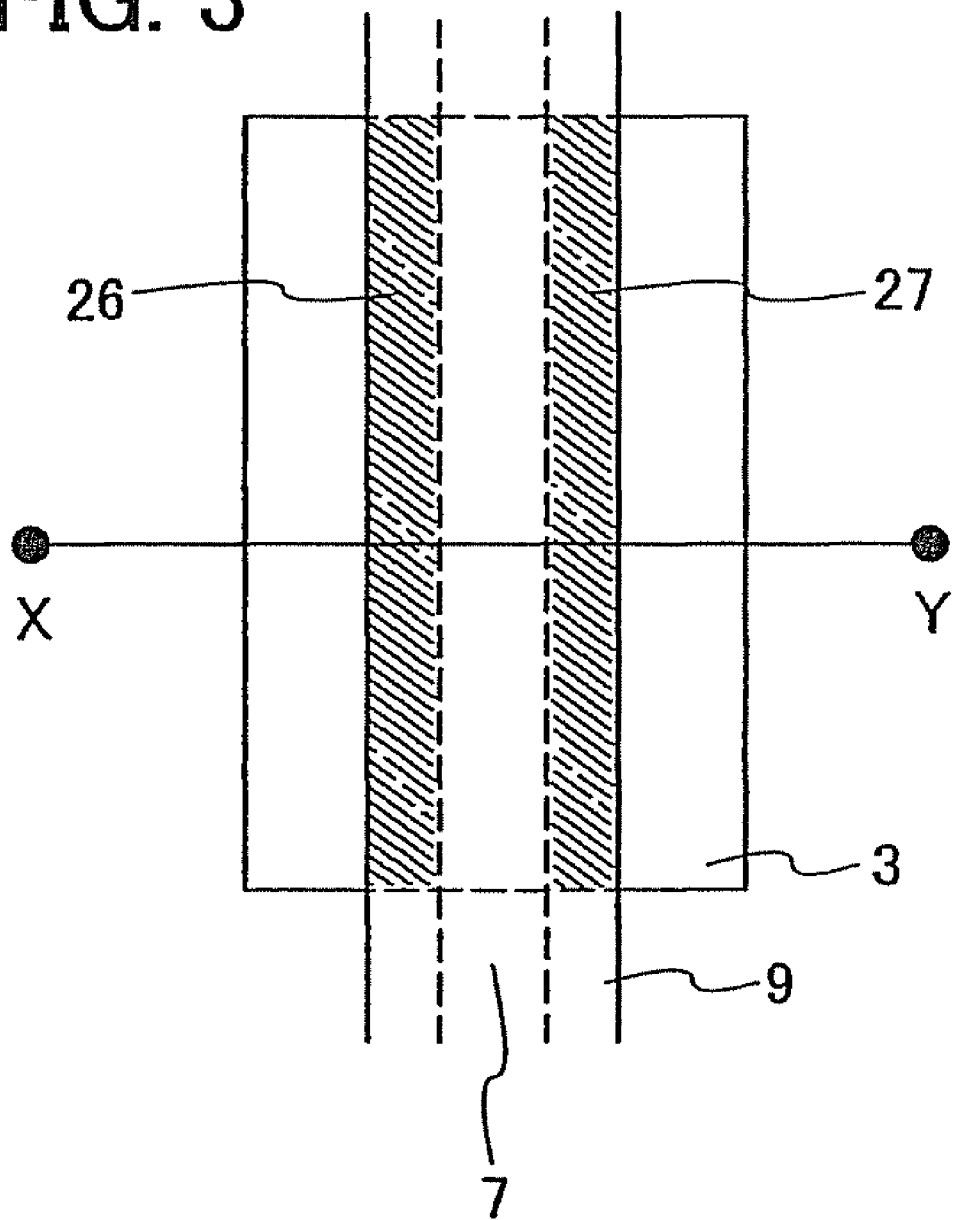

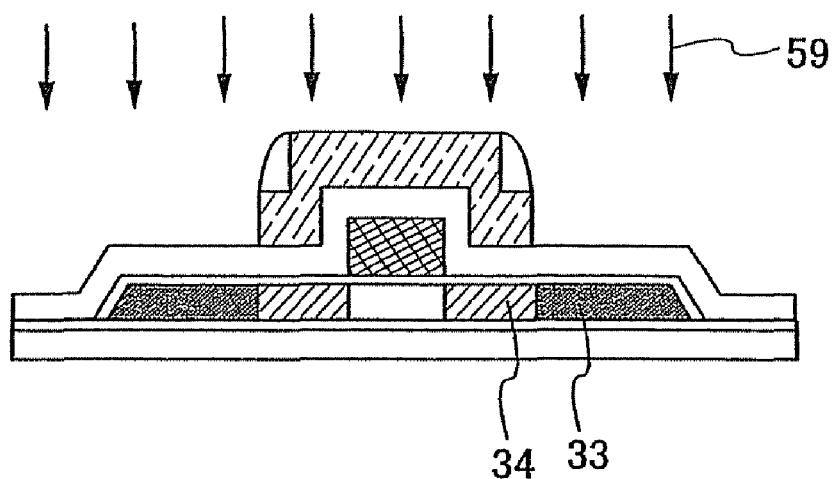
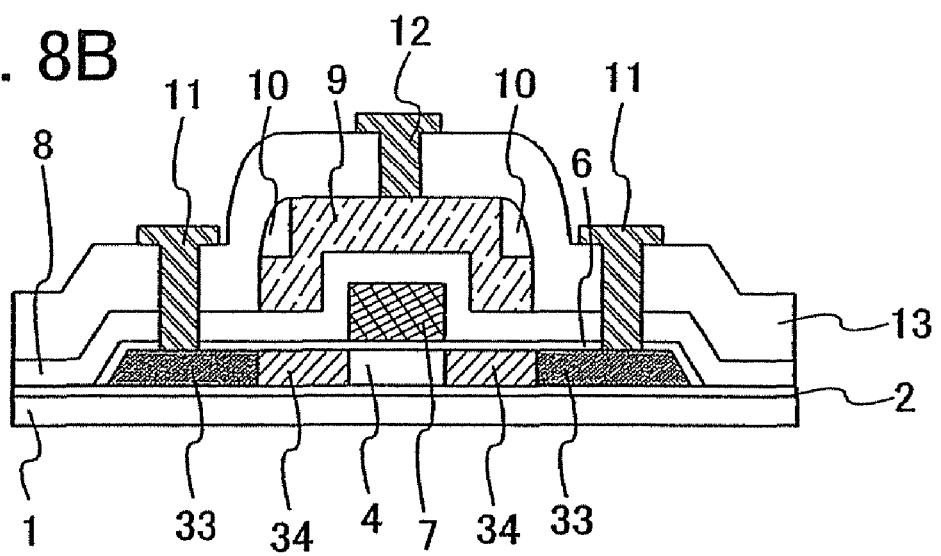

30  31  32

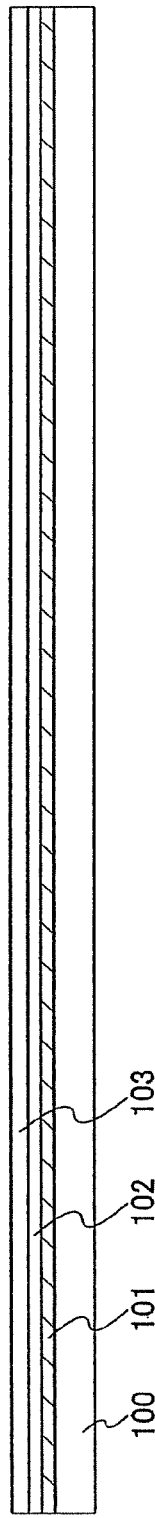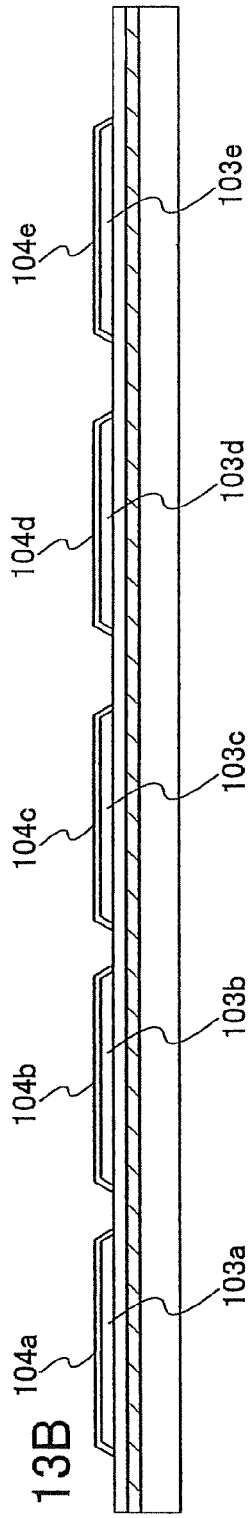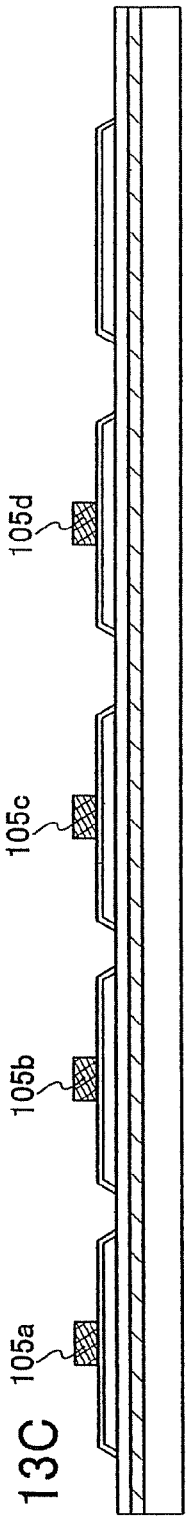

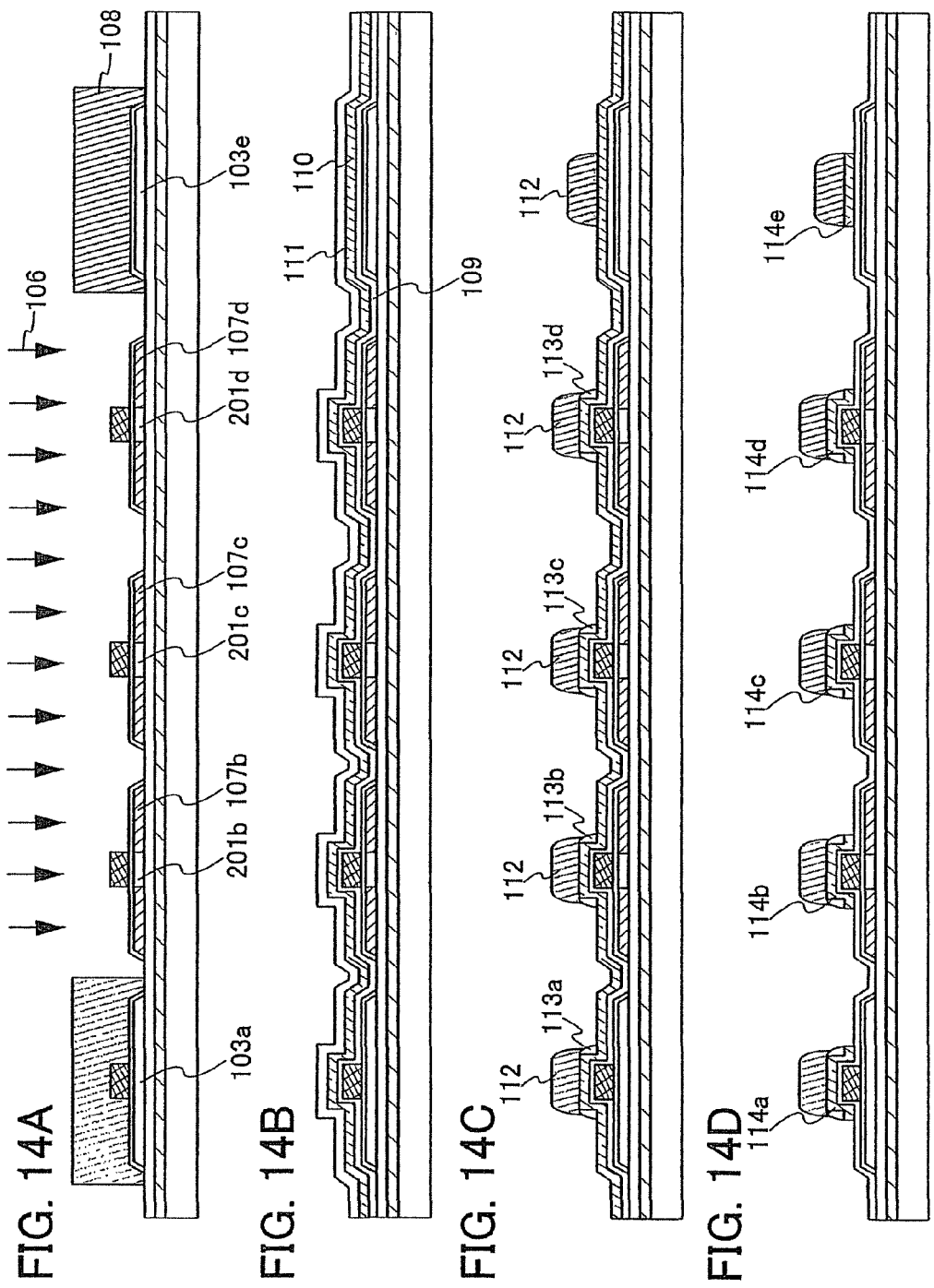

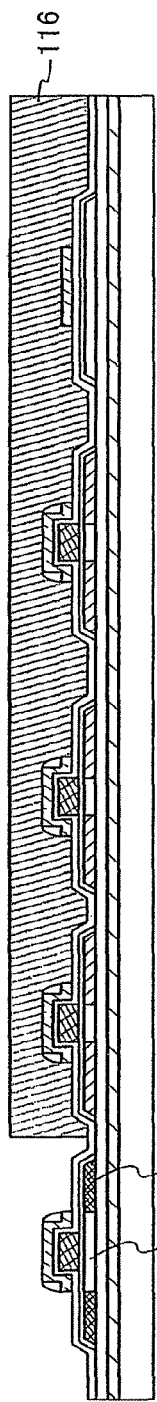
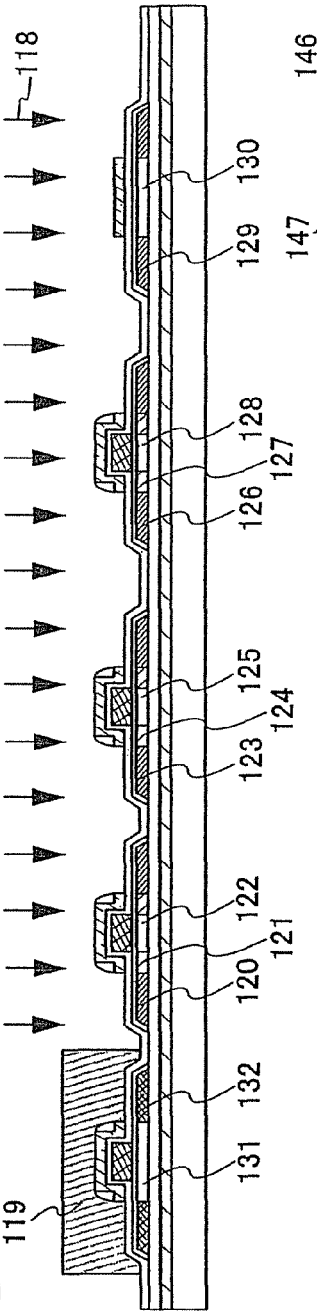
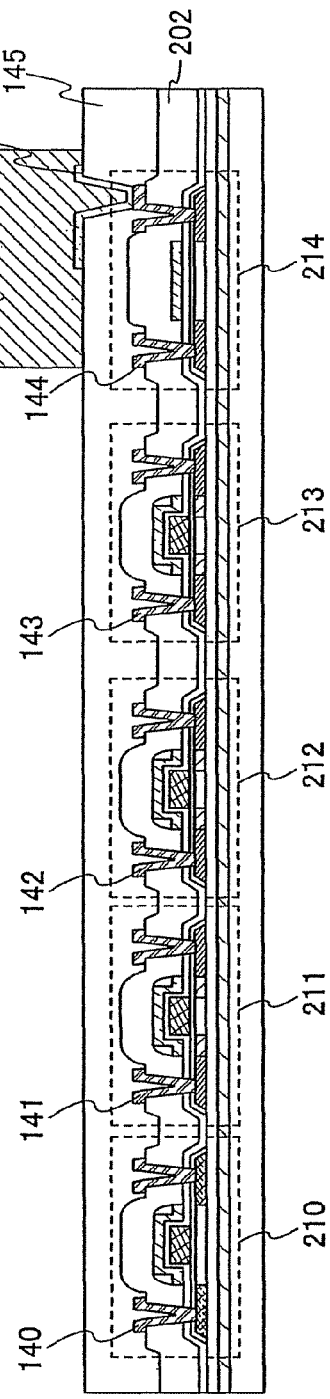
FIG. 15A
FIG. 15B
FIG. 15C

SEMICONDUCTOR DEVICE AND MANUFACTURING METHOD THEREOF This application is a divisional of U.S. application Ser. No. 11/643,195, filed on Dec. 20, 2006 now U.S. Pat. No. 7,968,932.

BACKGROUND OF THE INVENTION

1. Field of the Invention

The present invention relates to a technique relating to a semiconductor device formed over a substrate.

2. Description of the Related Art

At present, semiconductor memory devices for a personal computer, a digital camera, a mobile phone device, a household electrical appliance, an RFID, and the like have been actively developed. In particular, various configurations and structures have been researched and developed mainly on an EEPROM, and a flash memory each having a floating gate structure. Techniques in which a semiconductor memory device is formed not only over a silicon wafer but over a glass substrate, a plastic substrate, and a silicon wafer including an insulating layer have also been developed. Such a semiconductor memory device is disclosed, for example, in Reference 1 (Japanese Published Patent Application No. Hei 5-82787) and the like. A structure of a semiconductor memory device disclosed in Reference 1 and the like is described with reference to FIGS. 12A to 12D.

A semiconductor memory device shown in FIG. 12A is disclosed in FIG. 1 of Reference 1. The semiconductor memory device of FIG. 12A has a semiconductor layer 1003 having a channel forming region 1003a and a source or drain region 1003b, a tunnel insulating film 1004, a floating gate electrode 1005, a middle insulating film 1006, and a control gate electrode 1007 over a semiconductor substrate 1000 over which an insulating film 1002 is formed.

On the other hand, a semiconductor memory device as shown in FIG. 12C is disclosed in FIG. 2 of Reference 1 and Reference 2 (Japanese Published Patent Application No. Hei 11-87545). Here, the semiconductor layer 1003, the tunnel insulating film 1004, the floating gate electrode 1005, a middle insulating film 1006, and the control gate electrode 1007 are formed over the semiconductor substrate 1000 over which the insulating film 1002 is formed. As shown in FIG. 12D, the semiconductor layer 1003, an insulating film 1004a, a floating gate layer 1005a, an insulating film 1006a, and a control gate layer 1007a are formed, and then collectively etched by using a resist mask 1008.

SUMMARY OF THE INVENTION

The semiconductor memory device shown in FIG. 12A is required that the resist mask 1008 is formed over the control gate layer 1007a for forming the control gate electrode 1007, and is etched to form a pattern. However, it is difficult to form the resist mask 1008 properly at a desired position since a misalignment occurs depending on alignment precision of a device when the resist mask 1008 is formed. Therefore, the resist mask 1008 is not formed at a symmetric position or at a nearly symmetric position with respect to the floating gate electrode 1005 (FIG. 12B).

Accordingly, a length 1009 of a region in which the control gate electrode 1007 and one of source and drain regions overlap each other is significantly different from a length 1010 of a region in which the control gate electrode 1007 and the other of the source and drain regions overlap each other (FIG. 12A).

On the other hand, in the semiconductor memory device shown in FIG. 12C, since the floating gate electrode 1005, the insulating film 1006, and the control gate electrode 1007 are collectively etched by using the resist mask 1008 shown in FIG. 12D, a problem of the misalignment which is shown in FIGS. 12A and 12B is not caused, however it is found that the retention property of a memory is poor. It is considered that this is because a leak occurs between the control gate electrode 1007 and the floating gate electrode 1005.

In view of the aforementioned circumstances, an object of the present invention is to provide a semiconductor device in which a control gate electrode is formed in a self-aligned manner without causing a problem of a misalignment, and a leak does not occur between the control gate electrode and a floating gate electrode, and a method of manufacturing the semiconductor device.

One feature of a semiconductor device of the present invention includes a semiconductor film, a first gate insulating film over the semiconductor film, a floating gate electrode over the first gate insulating film, a second gate insulating film which covers the floating gate electrode, and a control gate electrode over the second gate insulating film. The control gate electrode is formed so as to cover the floating gate electrode with the second gate insulating film interposed therebetween. A sidewall is formed on the control gate electrode. The sidewall is formed on a stepped portion of the control gate electrode, generated due to the floating gate electrode.

Another feature of the semiconductor device of the present invention includes a channel forming region, a source region and a drain region which are provided in the semiconductor film. The control gate electrode is overlapped with the source region and the drain region with the first gate insulating film and the second gate insulating film interposed therebetween. A length of a gate length direction in a region in which the control gate electrode and one of the source region and the drain region overlap each other is equal to or almost equal to a length of a gate length direction in a region in which the control gate electrode and the other of the source region and the drain region overlap each other.

Another feature of the semiconductor device of the present invention includes a channel forming region, a source region and a drain region which are provided in the semiconductor film. The control gate electrode is overlapped with the source region and the drain region with the first gate insulating film and the second gate insulating film interposed therebetween. An area of a region in which the control gate electrode and one of the source region and the drain region overlap each other is equal to or almost equal to an area of a region in which the control gate electrode and the other of the source region and the drain region overlap each other.

Another feature of the semiconductor device of the present invention includes a channel forming region, a pair of first impurity regions, and a pair of second impurity regions which are provided in the semiconductor film. The channel forming region is provided between the pair of first impurity regions. The second impurity region is provided between the channel forming region and the first impurity region. The control gate electrode is overlapped with the pair of second impurity regions with the first gate insulating film and the second gate insulating film interposed therebetween. A length of a gate length direction in a region in which the control gate electrode and one of the pair of second impurity regions overlap each other is equal to or almost equal to a length of a gate length direction in a region in which the control gate electrode and the other of the pair of second impurity regions overlap each other.

Another feature of the semiconductor device of the present invention includes a channel forming region, a pair of first impurity regions, and a pair of second impurity regions which are provided in the semiconductor film. The channel forming region is provided between the pair of first impurity regions. The second impurity region is provided between the channel forming region and the first impurity region. The control gate electrode is overlapped with the pair of second impurity regions with the first gate insulating film and the second gate insulating film interposed therebetween. An area of a region in which the control gate electrode and one of the pair of second impurity regions overlap each other is equal to or almost equal to an area of a region in which the control gate electrode and the other of the pair of second impurity regions overlap each other.

Another feature of the semiconductor device of the present invention includes a semiconductor film, a first gate insulating film over the semiconductor film, a floating gate electrode over the first gate insulating film, a second gate insulating film which covers the floating gate electrode, and a control gate electrode over the second gate insulating film. The floating gate electrode includes a first floating gate electrode and a second floating gate electrode over the first floating gate electrode. A gate length of the first floating gate electrode is larger than a gate length of the second floating gate electrode. The control gate electrode is formed so as to cover the floating gate electrode with the second gate insulating film interposed therebetween. A sidewall is formed on the control gate electrode. The sidewall is formed on a stepped portion of the control gate electrode, generated due to the floating gate electrode.

Another feature of the semiconductor device of the present invention includes a channel forming region, a pair of lightly doped drain (hereinafter referred to as LDD) regions, a source region, and a drain region which are provided in the semiconductor film. The control gate electrode is overlapped with the LDD regions with the first gate insulating film and the second gate insulating film interposed therebetween. A length of a gate length direction in a region in which the control gate electrode and one of the pair of LDD regions overlap each other is equal to or almost equal to a length of a gate length direction in a region in which the control gate electrode and the other of the pair of LDD regions overlap each other.

Another feature of the semiconductor device of the present invention includes a channel forming region, a pair of LDD regions, a source region, and a drain region which are provided in the semiconductor film. The control gate electrode is overlapped with the LDD regions with the first gate insulating film and the second gate insulating film interposed therebetween. An area of a region in which the control gate electrode and one of the pair of LDD regions overlap each other is equal to or almost equal to an area of a region in which the control gate electrode and the other of the pair of LDD regions overlap each other.

Another feature of the semiconductor device of the present invention includes a channel forming region, a pair of first impurity regions, a pair of second impurity regions, and a pair of third impurity regions which are provided in the semiconductor film. The channel forming region is provided between the pair of first impurity regions. The second impurity region is provided between the channel forming region and the first impurity region. The third impurity region is provided between the second impurity region and the first impurity region. The control gate electrode is overlapped with the pair of third impurity regions with the first gate insulating film and the second gate insulating film interposed therebetween. A length of a gate length direction in a region in which the control gate electrode and one of the pair of third impurity regions overlap each other is equal to or almost equal to a length of a gate length direction in a region in which the control gate electrode and the other of the pair of third impurity regions overlap each other.

Another feature of the semiconductor device of the present invention includes a channel forming region, a pair of first impurity regions, a pair of second impurity regions, and a pair of third impurity regions which are provided in the semiconductor film. The channel forming region is provided between the pair of first impurity regions. The second impurity region is provided between the channel forming region and the first impurity region. The third impurity region is provided between the second impurity region and the first impurity region. The control gate electrode is overlapped with the pair of third impurity regions with the first gate insulating film and the second gate insulating film interposed therebetween. An area of a region in which the control gate electrode and one of the pair of third impurity regions overlap each other is equal to or almost equal to an area of a region in which the control gate electrode and the other of the pair of third impurity regions overlap each other.

Another feature of the semiconductor device of the present invention includes forming a first gate insulating film over a semiconductor film, forming a floating gate electrode over the first gate insulating film, forming a second gate insulating film so as to cover the floating gate electrode, forming a conductive film over the second gate insulating film, forming a film over the conductive film, subjecting the film to anisotropic etching to form a sidewall on a stepped portion which is generated in the conductive film due to the floating gate electrode, forming a mask over an upper step portion of the stepped portion generated in the conductive film due to the floating gate electrode over the conductive film, and etching the conductive film by using the mask and the sidewall to form a control gate electrode.

Another feature of the semiconductor device of the present invention is that the mask is formed so as to cover only the whole of the upper step portion of the conductive film, and the sidewall.

Another feature of the semiconductor device of the present invention is that n-type or p-type impurities are added to the semiconductor film by using the floating gate electrode as a mask, so that a channel forming region, a source region, and a drain region are formed in the semiconductor film.

Another feature of the semiconductor device of the present invention is that the control gate electrode is overlapped with the source region and the drain region with the first gate insulating film and the second gate insulating film interposed therebetween. A length of a gate length direction in a regions in which the control gate electrode and one of the source region and the drain region overlap each other is equal to or almost equal to a length of a gate length direction in a region in which the control gate electrode and the other of the source region and the drain region overlap each other.

Another feature of the semiconductor device of the present invention is that the control gate electrode is overlapped with the source region and the drain region with the first gate insulating film interposed therebetween. An area of a region in which the control gate electrode and one of the source region and the drain region overlap each other is equal to or almost equal to an area of a region in which the control gate electrode and the other of the source region and the drain region overlap each other.

Another feature of the semiconductor device of the present invention is that n-type or p-type impurities are added to the semiconductor film by using the floating gate electrode as a mask, and the same conductive impurities as the n-type or p-type impurities are added to the semiconductor film by using the control gate electrode as a mask, so that a channel forming region, a pair of first impurity regions, and a pair of second impurity regions are formed in the semiconductor film, in which the pair of second impurity regions are formed in a region overlapped with the control gate electrode with the first gate insulating film and the second gate insulating film interposed therebetween.

Another feature of the semiconductor device of the present invention is that a length of a gate length direction in a region in which the control gate electrode and one of the pair of second impurity regions overlap each other is equal to or almost equal to a length of a gate length direction in a region in which the control gate electrode and the other of the pair of second impurity regions overlap each other.

Another feature of the semiconductor device of the present invention is that an area of a region in which the control gate electrode and one of the pair of second impurity regions overlap each other is equal to or almost equal to an area of a region in which the control gate electrode and the other of the pair of second impurity regions overlap each other.

Another feature of the semiconductor device of the present invention includes forming a first gate insulating film over a semiconductor film, forming a first conductive film over the first gate insulating film, forming a second conductive film over the first conductive film, forming a mask over the second conductive film, performing a first etching by using the mask to make the first conductive film a first floating gate electrode and make the second conductive film a fourth conductive film, performing a second etching in which a side of the fourth conductive film is etched to form a second floating gate electrode which has a shorter gate length than that of the first floating gate electrode, so that a floating gate electrode including the first floating gate electrode and the second floating gate electrode is formed, forming a second gate insulating film so as to cover the floating gate electrode, forming a conductive film over the second gate insulating film, forming a film over the conductive film, subjecting the film to anisotropic etching to form a sidewall on a stepped portion which is generated in the conductive film due to the floating gate electrode, forming a mask over an upper region of the conductive film overlapped with the floating gate electrode over the conductive film, and forming a control gate electrode by etching the conductive film using the mask and the sidewalls.

Another feature of the semiconductor device of the present invention is that the mask is formed so as to cover only the whole of the upper step portion of the conductive film and the sidewall.

Another feature of the semiconductor device of the present invention is that n-type or p-type impurities are added to the semiconductor film by using the floating gate electrode as a mask, so that a channel forming region, a pair of LDD regions, a source region and a drain region are formed in the semiconductor film.

Another feature of the semiconductor device of the present invention is that the control gate electrode is overlapped with the LDD regions with the first gate insulating film interposed therebetween, and a length of a gate length direction in a region in which the control gate electrode and one of the pair of LDD regions overlap each other is equal to or almost equal to a length of a gate length direction in a region in which the control gate electrode and the other of the pair of LDD regions overlap each other.

Another feature of the semiconductor device of the present invention is that the control gate electrode is overlapped with the LDD regions with the first gate insulating film interposed therebetween, and an area of a region in which the control gate electrode and one of the pair of LDD regions overlap each other is equal to or almost equal to an area of a region in which the control gate electrode and the other of the pair of LDD regions overlap each other.

Another feature of the semiconductor device of the present invention is that n-type or p-type impurities are added to the semiconductor film by using the floating gate electrode as a mask, and the same conductive impurities as the n-type or p-type impurities are added to the semiconductor film by using the control gate electrode as a mask to form a channel forming region, a pair of first impurity regions, a pair of second impurity regions, and a pair of third impurity regions in the semiconductor film, in which the second impurity region is formed between the third impurity region and a channel forming region, the third impurity region is formed between the first impurity region and the second impurity region, and the pair of third impurity regions are formed in a region overlapped with the control gate electrode with the first gate insulating film and the second gate insulating film interposed therebetween.

Another feature of the semiconductor device of the present invention is that a length of a gate length direction in a region in which the control gate electrode and one of the pair of third impurity regions overlap each other is equal to or almost equal to a length of a gate length direction in a region in which the control gate electrode and the other of the pair of third impurity regions overlap each other.

Another feature of the semiconductor device of the present invention is that an area of a region in which the control gate electrode and one of the pair of third impurity regions overlap each other is equal to or almost equal to an area of a region in which the control gate electrode and the other of the pair of third impurity regions overlap each other. The aforementioned phrase "one area is almost equal to another area" implies that a value (x), which is calculated by a formula 1, is within 20%, preferably within 15% when one area defines A and other area defines B.

$$x = \frac{|A - B|}{A} \times 100 \qquad \text{Formula 1}$$

On the other hand, the aforementioned phrase "one length is almost equal to another length" implies that a value (y), which is calculated by a formula 2, is within 20%, preferably within 15% when one length defines C and other length defines D.

$$y = \frac{|C - D|}{C} \times 100 \qquad \text{Formula 2}$$

In addition, the present invention can be applied as a thin film transistor in which electrical conduction is provided between the floating gate electrode and the control gate electrode (they are connected electrically), and the first gate insulating film serves as a gate insulating film.

Since the floating gate electrode is covered with the second gate insulating film (control insulating film), a retention property is good without generating a leak between the control gate electrode and the floating gate electrode.

Since the impurity regions are formed in a region overlapped with the floating gate electrode with the first gate insulating film (tunnel insulating film) interposed therebetween, carrier injection efficiency can be increased.

A length and an area of a region in which the control gate electrode and one of the impurity regions overlap each other are equal to or almost equal to a length and an area of a region in which the control gate electrode and the other of the impurity regions overlap each other. Therefore, deterioration by a hot carrier can be suppressed, and a semiconductor device having small variation and a good property can be obtained. This can be manufactured by forming sidewalls made of an insulator on stepped portions which are generated in the conductive film to be the control gate electrode due to the floating gate electrode, forming a mask over the upper step portion of the stepped portions generated in the conductive film due to the floating gate electrode over the conductive film, etching the conductive film by using the mask and the sidewalls to form the control gate electrode. Using this manufacturing method does not cause a misalignment when a pattern is formed, and a control gate electrode can be formed at a desired position in a self-aligned manner.

In addition, by forming a structure in which electrical conduction is provided between the floating gate and the control gate are electrically connected to each other, a thin film transistor in which the first gate insulating film is a gate insulating film can be formed. A logic thin film transistor and a semiconductor memory device can be formed simultaneously depending on whether electrical conduction is provided or not between the floating gate and the control gate.

Further, a capacitor between a side of the floating gate electrode and the control gate electrode can be formed, as well as a capacitor between a top surface of the floating gate electrode and the control gate electrode. Therefore, by capacitive coupling formed between the control gate electrode and the floating gate electrode and between the channel forming region and the floating gate electrode, an electric field can be easily applied between the floating gate electrode and the channel forming region. Accordingly, writing voltage and erasing voltage of a signal to be applied to the control gate electrode can be reduced.

BRIEF DESCRIPTION OF DRAWINGS

FIG. 3 is diagram illustrating a semiconductor device of the present invention.

FIGS. 8A and 8B are diagrams illustrating a manufacturing process of a semiconductor device according to the present invention.

FIGS. 13A to 13 C are diagrams illustrating a manufacturing process of an ID chip.

FIGS. 14A to 14D are diagrams illustrating a manufacturing process of an ID chip.

FIGS. 15A to 15C are diagrams illustrating a manufacturing process of an ID chip.

DETAILED DESCRIPTION OF THE INVENTION

Embodiment Mode

Hereinafter, best modes to implement the present invention will be described with reference to the accompanying drawings. However, the present invention can be implemented in various modes, and it is to be understood that various changes and modifications will be apparent to those skilled in the art. Therefore, unless such changes and modifications depart from the scope of the invention, they should be construed as being included therein.

(Embodiment Mode 1)

A structure of a semiconductor device or the like is described here.

Figure 1A:
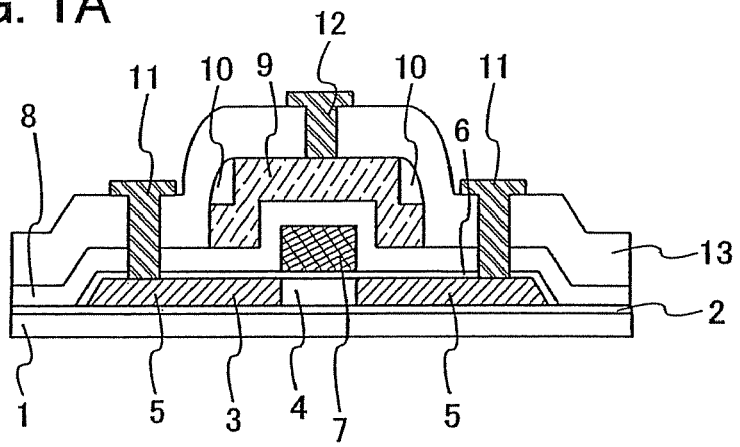
FIGS. 1A to 1C are diagrams illustrating a semiconductor device of the present invention.

FIG. 1A is a schematic cross-sectional diagram showing an example of an embodiment mode of the present invention. Reference numeral 1 denotes a substrate, 2 denotes a base insulating film, 3 denotes a semiconductor film, 4 denotes a channel forming region, 5 denotes a source or drain region, 6 denotes a first gate insulating film (also called a tunnel insulating film), 7 denotes a floating gate electrode, 8 denotes a second gate insulating film (also called a control insulating film), 9 denotes a control gate electrode, 10 denotes a sidewall, 11 denotes a source or drain electrode electrically connected to the source or drain region 5, 12 denotes a gate wire electrically connected to the control gate electrode 9, and 13 denotes a passivation insulating film. The source or drain electrode 11, the gate wire 12, and the passivation insulating film 13 are formed if necessary.

In a structure shown in FIG. 1A, the base insulating film 2 is formed over the substrate 1. The semiconductor film 3 having the source or drain region 5 and the channel forming region 4 is formed over the base insulating film 2. The first gate insulating film 6 is formed over the semiconductor film 3. The floating gate electrode 7 is formed over the first gate insulating film 6. The second gate insulating film 8 is formed over the floating gate electrode 7 and the first gate insulating film 6. The control gate electrode 9 is formed over the second gate insulating film 8. The sidewall 10 is formed on the control gate electrode 9. In addition, the insulating film 13 is formed over the second gate insulating film 8, the control gate electrode 9, and the sidewalls 10. The source or drain electrode 11 is electrically connected to the source or drain region 5 with the insulating film 13, the second gate insulating film 8, and the first gate insulating film 6 interposed therebetween. The gate wire 12 is electrically connected to the control gate electrode 9 with the insulating film 13 interposed therebetween. An insulating film for planarization may be formed on the insulating film 13.

In addition, the second gate insulating film 8 is formed so as to cover the floating gate electrode 7.

Figure 1B:
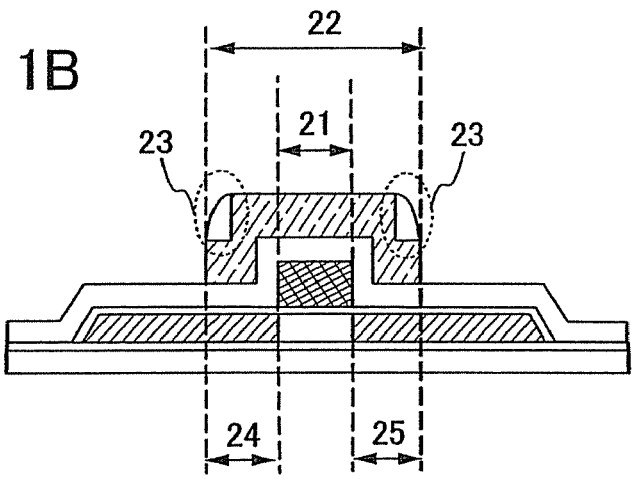

FIG. 1B is a part of FIG. 1A. As shown in FIG. 1B, the control gate electrode 9 is formed so as to cover the floating gate electrode 7 with the second gate insulating film 8 interposed therebetween, and a gate length 22 of the control gate electrode 9 is larger than a gate length 21 of the floating gate electrode 7. Note that "a gate length" in this specification means a length of a gate electrode in a direction in which a carrier moves within a channel region when the transistor is operated. In a gate electrode structured by two different conductive layers, gate lengths can be defined in the respective layers. For example, in a gate electrode structured by a first conductive film and a second conductive film formed over the first conductive film, a gate length of the first conductive film is defined as a length of the aforementioned direction of the first conductive film, and a gate length of the second conductive film is defined as a length of the aforementioned direction of the second conductive film.

The sidewall 10 is formed on a stepped portion 23 generated in the control gate electrode 9 by the existence of the floating gate electrode 7. Note that although the sidewall 10 is formed on the stepped portion 23, the sidewall 10 is not formed on the second gate insulating film 8.

The control gate electrode 9 is overlapped with the source and drain regions 5 with the first gate insulating film 6 and the second gate insulating film 8 interposed therebetween. A length 24 of a region in which the control gate electrode 9 and one of the source and drain regions 5 overlap each other is equal to or almost equal to a length 25 of a region in which the control gate electrode 9 and the other of the source and drain regions 5 overlap each other. The length here refers to a length of a gate length direction or a channel length direction.

FIG. 3 is a top diagram of FIG. 1B. FIG. 1B is a cross-sectional diagram taken along a line X-Y of FIG. 3. As shown in FIG. 3, an area 26 of the region in which the control gate electrode 9 and one of the source and drain regions 5 overlap each other is equal to or almost equal to an area 27 of the region in which the control gate electrode 9 and the other of the source and drain regions 5 overlap each other.

Since the control gate electrode is formed by using the sidewall 10, the lengths of the overlapped regions or the areas thereof are equal to or almost equal to each other. A manufacturing method is described later.

Figure 1C:
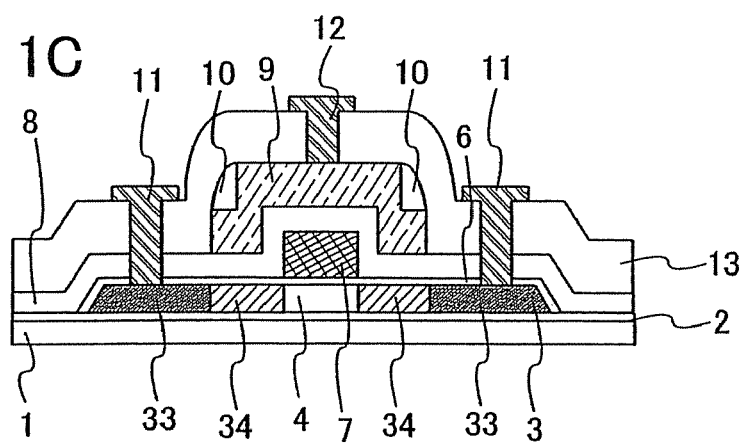

As shown in FIG. 1C, second impurity regions 34, for example, low concentration impurity regions (LDD regions) may be provided in regions overlapped with the control gate electrode 9 in the semiconductor film 3, as well as the channel forming region 4 and source or drain region 33.

In this case, a length and an area of a region in which the control gate electrode 9 and one of the second impurity regions 34 overlap each other are equal to or almost equal to a length and an area of a region in which the control gate electrode 9 and the other of a second impurity regions 34 overlap each other.

Each structural element shown in FIGS. 1A to 1C is described below.

(1) The Substrate and the Insulating Film are Described.

A glass substrate, a substrate formed of an insulating material such as alumina, a plastic substrate having heat resistance which can resist a processing temperature in a later step, a semiconductor substrate, or the like can be used. In the case where a plastic substrate is used as the substrate 1, PC (polycarbonate), PES (polyethersulfone), PET (polyethylene terephthalate), PEN (polyethylene naphthalate), or the like can be used. In the case where a plastic substrate is used, an inorganic layer or an organic layer may be provided as a gas barrier layer on its surface. In the case where a protrusion is generated by dust or the like on a plastic substrate at the time of forming the plastic substrate, the substrate may be used after being polished by CMP or the like and planarized. In the case where a semiconductor substrate is used, not only a silicon wafer but a silicon wafer which is polished or the like to be thin as a film substrate or a silicon wafer including an insulating layer may be used. The base insulating film 2 for preventing impurities or the like from diffusing from the substrate side is formed of silicon oxide ($SiO_x$), silicon nitride ($SiN_x$), silicon oxynitride ($SiO_xN_y$) (x>y), silicon nitride oxide ($SiN_xO_y$) (x>y), or the like, over the substrate 1 by a CVD method, a sputtering method, high density plasma treatment, or the like.

(2) The Semiconductor Film is Described.

Silicon, silicon-germanium, silicon-germanium-carbon, ZnO, or the like is used. The semiconductor film is formed with a thickness of 20 to 100 nm. A known CVD method, sputtering method, or the like can be used as the forming method. Any of an amorphous semiconductor film, a crystalline semiconductor film, or a single crystal semiconductor which is obtained from the above semiconductor substrate or the like may be used. As a crystallization method, heat crystallization, crystallization by heat treatment in a state in which a metal element has been added, laser crystallization, a combination of them, or the like is used. The source or drain region 5 and the channel forming region 4 are formed in the semiconductor film 3, and n-type or p-type impurities are added to the source or drain region. The second impurity regions 34, for example an LDD region, may be provided.

(3) The First Gate Insulating Film is Described.

The first gate insulating film is formed with a thickness of 5 to 20 nm by using a silicon oxide film, a silicon oxynitride film, or the like. Since the first gate insulating film functions as a tunnel insulating film, a film with high quality is required. To form the first gate insulating film at a low temperature, a CCP (Capacitively Coupled Plasma) plasma CVD method, an ECR (Electron Cyclotron Resonance) plasma CVD method, a method of forming an oxide film by performing high density plasma oxidation treatment to a semiconductor film, or the like is used. Further, an oxide film formed by forming a silicon oxynitride film by a plasma CVD method and then performing high density plasma oxidation treatment to the silicon oxynitride film, may also be used. Either a single layer or a stacked-layer film may be used.

(4) The Floating Gate Electrode and the Control Gate Electrode are Described.

A known conductive film can be used. For example, a film formed of an element selected from tantalum (Ta), titanium (Ti), molybdenum (Mo), tungsten (W), chrome (Cr), or silicon (Si), a film formed of a nitride of the element (typically, a tantalum nitride film, a tungsten nitride film, or a titanium nitride film), an alloy film combined with the elements (typically, a Mo—W alloy or a Mo—Ta alloy), or a silicide film of the element (typically, a tungsten silicide film, a titanium silicide film, or a nickel silicide film) can be used. Impurities such as phosphorus or boron may be added to the silicon film. A single-layer conductive film may be used, and a stacked-layer film of two layers or three layers may be used. The floating gate electrode and the control gate electrode are formed by a sputtering method or a CVD method.

(5) The Second Gate Insulating Film is Described.

A silicon oxide film, a silicon oxynitride film, a silicon nitride oxide film, or the like can be used by a CVD method or a sputtering method. The second gate insulating film may be either a single layer or a stacked-layer film. Further, an oxide film formed by forming a silicon oxynitride film by a plasma CVD method and then performing high density plasma oxidation treatment to the silicon oxynitride film, may also be used. A stacked-layer film of an oxide film formed by performing high density plasma oxidation treatment to the first gate insulating film and the floating gate electrode, a silicon oxynitride film formed by a plasma CVD method, and an oxide film formed by high density plasma oxidation treatment to the silicon oxynitride film may also be used. Further, a stacked-layer film of an oxide film formed by performing high density plasma oxidation treatment to the first gate insulating film and the floating gate electrode, a nitride film formed by performing high density plasma oxidation treatment to the oxide film, and a silicon oxynitride film formed by a plasma CVD method can also be used.

(6) The Sidewall is Described.

An insulating film such as a silicon oxide film, a silicon oxynitride film, or a silicon nitride oxide film can be used. A conductive film of tantalum (Ta), titanium (Ti), molybdenum (Mo), tungsten (W), or the like can also be used. Any kind of film can be used as long as a film has high selection ratio of etching at the time of etching the control gate electrode and can be formed so as to cover a side of a stepped shape. Either a single layer or a stacked-layer film may be used. The insulating film or the conductive film is formed over the conductive film which forms the control gate electrode 9, and then anisotropic etching is performed, thereby the sidewall 10 is formed. Accordingly, the sidewall 10 can be formed on the stepped portion 23 generated in the control gate electrode 9 by the existence of the floating gate electrode 7.

(7) The Source Electrode, the Drain Electrode, and the Gate Wire are Described.

An Al film, an Al alloy film such as AlNd (aluminum neodymium) film, a Ti film, a Cu film, a Mo film, a W film, or the like can be used. A film of a nitride of the element (typically, a titanium nitride film) may be used. Either a single layer or a stacked-layer film may be used, and for example, a three-layer structure of a Ti film, an Al film or an Al film including Ti, and a Ti film can be used. The source electrode, the drain electrode, and the gate wire are formed by a sputtering method typically.

(8) The Insulating Film is Described.

A silicon oxide film, a silicon nitride film, a silicon oxynitride film, a silicon nitride oxide film, a SOG (Spin-On-Glass) film, an organic resin film of acrylic or the like, or a stacked-layer film of them can be used.

In the above-described semiconductor device, since the control gate electrode 9 is covered with the second gate insulating film 8, a retention property is good without generating a leak between the control gate electrode 9 and the floating gate electrode 7. The length and the area of the region in which the control gate electrode 9 and one of the source and drain regions overlap each other are equal to or almost equal to the length and the area of the region in which the control gate electrode 9 and the other of the source and drain regions overlap each other. Therefore, deterioration by a hot carrier is suppressed, and a semiconductor device having small variation and a good property is formed.

(Embodiment Mode 2)

Here, a structure of a semiconductor device, or the like which is different from that of Embodiment Mode 1 is described. The differences from the semiconductor device of Embodiment Mode 1 are that first impurity regions 15, second impurity regions 14 and the like are provided in the semiconductor film 3, that the floating gate electrode 7 is structured by a first floating gate electrode 7a and a second floating gate electrode 7b, and the like.

Figure 2A:
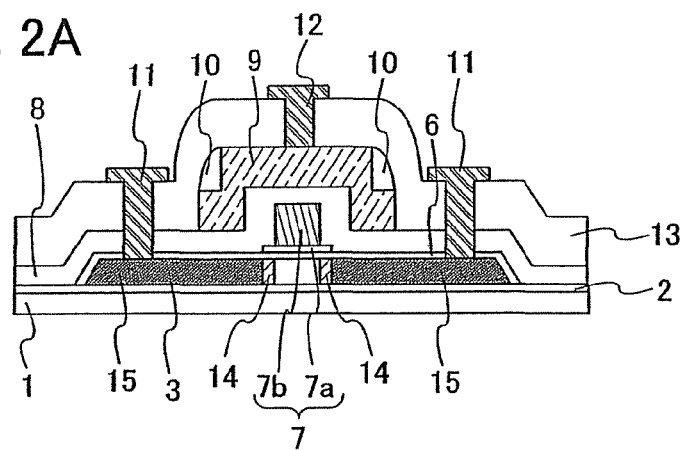
FIGS. 2A to 2D are diagrams illustrating a semiconductor device of the present invention.
Figure 2B:
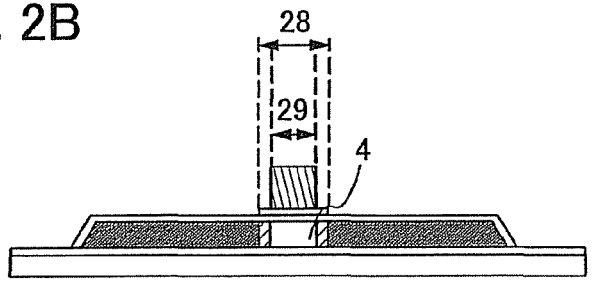
Figure 2C:
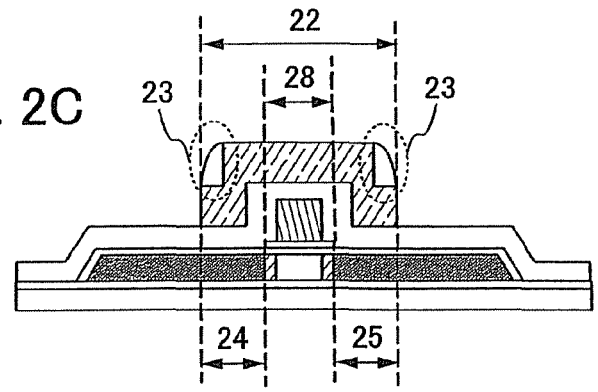

FIG. 2A is a schematic cross-sectional diagram showing an example of another embodiment mode of the present invention. FIGS. 2B and 2C are a part of FIG. 2A. Note that the same portions are denoted by the same reference numerals as Embodiment Mode 1.

In FIG. 2A, reference numeral 7 denotes the floating gate electrode, 7a denotes the first floating gate electrode, 7b denotes the second floating gate electrode, 14 denotes the second impurity region, and 15 denotes the first impurity region.

In a structure shown in FIG. 2A, the base insulating film 2 is formed over the substrate 1. The semiconductor film 3 having the first impurity regions 15, the second impurity regions 14, and the channel forming region 4 is formed over the base insulating film 2. The first gate insulating film 6 is formed over the semiconductor film 3. The floating gate electrode 7 is formed over the first gate insulating film 6. The second gate insulating film 8 is formed over the floating gate electrode 7 and the first gate insulating film 6. The control gate electrode 9 is formed over the second gate insulating film 8. The sidewall 10 is formed on the control gate electrode 9. In addition, the insulating film 13 is formed over the second gate insulating film 8, the control gate electrode 9, and the sidewalls 10. The source or drain electrode 11 is electrically connected to the source or drain region 5 with the insulating film 13, the second gate insulating film 8, and the first gate insulating film 6 interposed therebetween. The gate wire 12 is electrically connected to the control gate electrode 9 with the insulating film 13 interposed therebetween. An insulating film for planarization may be formed on the insulating film 13. The source or drain electrode 11, the gate wire 12, and the passivation insulating film 13 are formed if necessary.

As shown in FIGS. 2A to 2D, the floating gate electrode 7 is structured by the first floating gate electrode 7a and the second floating gate electrode 7b. A gate length 28 of the first floating gate electrode 7a is larger than a gate length 29 of the second floating gate electrode 7b (FIG. 2B).

The second impurity regions 14 are formed between the first impurity regions 15 and the channel forming region 4 in the semiconductor film 3. The second impurity regions 14 are formed in regions almost overlapped with the floating gate electrode 7 with the first gate insulating film interposed therebetween.

The second gate insulating film 8 is formed so as to cover the floating gate electrode 7.

The control gate electrode 9 is formed so as to cover the floating gate electrode 7 with the second gate insulating film 8 interposed therebetween, and the gate length 22 of the control gate electrode 9 is larger than the gate length 28 of the first floating gate electrode 7a (FIG. 2C).

The sidewall 10 is formed on the stepped portion 23 generated in the control gate electrode 9 by the existence of the floating gate electrode 7.

The control gate electrode 9 is overlapped with the first impurity regions 15 with the first gate insulating film 6 and the second gate insulating film 8 interposed therebetween. And these are the same as Embodiment mode 1 that the length 24 of a region in which the control gate electrode 9 and one of the first impurity regions 15 overlap each other is equal to or almost equal to the length 25 of a region in which the control gate electrode 9 and the other of the first impurity regions 15 overlap each other, and an area of the region in which the control gate electrode 9 and one of the first impurity regions 15 overlap each other is equal to or almost equal to an area of the region in which the control gate electrode 9 and the other of the first impurity regions 15 overlap each other (FIG. 3).

Figure 2D:
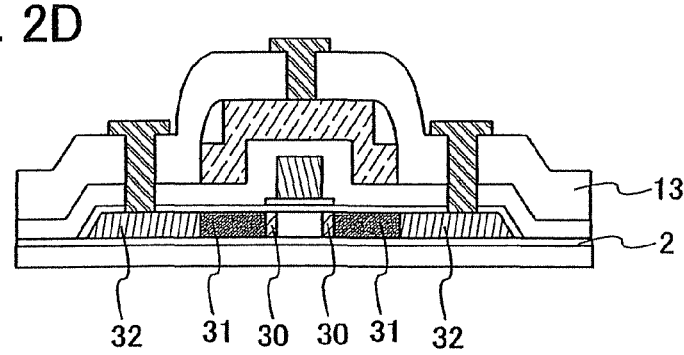

Further, as shown in FIG. 2D, third impurity regions 31 may be provided in regions overlapped with the control gate electrode 9 between second impurity regions 30 and first impurity regions 32, in addition to the first impurity regions 32 and the second impurity regions 30 in the semiconductor film 3.

In this case, a length and an area of the region in which the control gate electrode 9 and one of the third impurity regions 31 overlap each other are equal to or almost equal to a length and an area of the region in which the control gate electrode and the other of the third impurity regions 31 overlap each other.

Each structural element shown in FIGS. 2A to 2D is described below. The substrate 1, the base insulating film 2, the first gate insulating film 6, the second gate insulating film 8, the control gate electrode 9, the sidewall 10, the source or drain electrode 11, the gate wire 12, and the insulating film 13 described in Embodiment Mode 1 can be used here.

(1) The Semiconductor Film is Described.

The semiconductor film described in Embodiment Mode 1 can be used as the semiconductor film 3. An n-type or p-type impurity concentration contained in the first impurity regions 15 may be the same or almost the same as an n-type or p-type impurity concentration contained in the second impurity regions 14. Alternatively, the n-type or p-type impurity concentration contained in the first impurity regions 15 may be larger than the n-type or p-type impurity concentration contained in the second impurity regions 14. In this case, the first impurity region is a high concentration impurity region, and the second impurity region is a low concentration impurity region (LDD region).

In addition, as shown in FIG. 2D, the third impurity regions 31 may be provided. An n-type or p-type impurity concentration contained in the third impurity regions 31 is set smaller than the n-type or p-type impurity concentration contained in the first impurity regions 32 and larger than the n-type or p-type impurity concentration contained in the second impurity regions 30.

(2) The Floating Gate Electrode is Described.

The first floating gate electrode 7a and the second floating gate electrode 7b are preferably formed of different conductive materials. The first floating gate electrode 7a is preferably formed of a conductive material with good adhesion to the first gate insulating film 6. For example, the first floating gate electrode 7a is preferably formed of titanium nitride (TiN), tantalum nitride (TaN), titanium (Ti), tantalum (Ta), or the like. In addition, a thickness of the first conductive layer is preferably in the range of 25 nm to 35 nm. The first floating gate electrode 7a is formed by a sputtering method.

The second floating gate electrode 7b is preferably formed of a conductive material having low resistivity; for example, the second floating gate electrode 7b is preferably formed of tungsten (W), molybdenum (Mo), aluminum (Al), or copper (Cu), an alloy of the metal as a main component, a metal compound, or the like. As the alloy, there are an alloy of aluminum and silicon, an alloy of aluminum and neodymium, and the like. As the metal compound, there are tungsten nitride and the like. Further, silicon (Si) may also be used, and a compound thereof (typically, titanium silicide, nickel silicide or the like) or silicon to which an impurity such as P or B is added may be used. The second conductive layer is preferably formed with a thickness in the range of 100 nm to 410 nm. The second floating gate electrode 7b is formed mainly by a sputtering method.

In the above-described semiconductor device, since the control gate electrode 9 is covered with the second gate insulating film 8, a retention property is good without generating a leak between the control gate electrode 9 and the floating gate electrode 7. In addition, the length and the area of the region in which the control gate electrode 9 and one of the source and drain regions 15 overlap each other are equal to or almost equal to the length and the area of the region in which the control gate electrode 9 and the other of the source and drain regions 15 overlap each other. Therefore, deterioration by a hot carrier is suppressed, and a semiconductor device having small variation and a good property can be obtained. Since the second impurity regions 14 or 30 are formed in the regions overlapped with the floating gate electrode 7 with the first gate insulating film 6 interposed therebetween, carrier injection efficiency can be increased.

(Embodiment Mode 3)

A method of manufacturing the semiconductor device described in Embodiment Mode 1, namely the semiconductor device shown in FIGS. 1A to 1C, is described here.

Figure 4A:
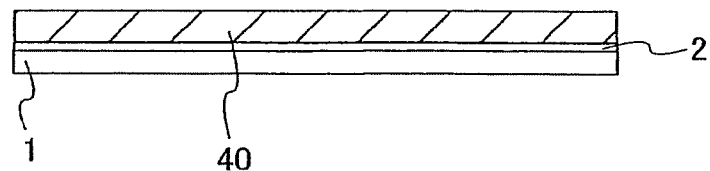
FIGS. 4A to 4G are diagrams illustrating a manufacturing process of a semiconductor device according to the present invention.

First, as shown in FIG. 4A, an insulating film 2 for preventing impurities or the like from diffusing from a substrate 1 side is formed with a thickness of 10 to 200 μm by using silicon oxide ($SiO_x$), silicon nitride ($SiN_x$), silicon oxynitride ($SiO_xN_y$) (x>y), silicon nitride oxide ($SiN_xO_y$) (x>y), or the like, over the substrate 1 having an insulating property such as a glass substrate or a plastic substrate.

Next, an amorphous silicon film is formed with a thickness of 40 to 100 nm by a CVD method as a semiconductor film 40. Since a crystalline silicon film 42 is used as the semiconductor film 3, the amorphous silicon film is crystallized here.

Figure 4B:
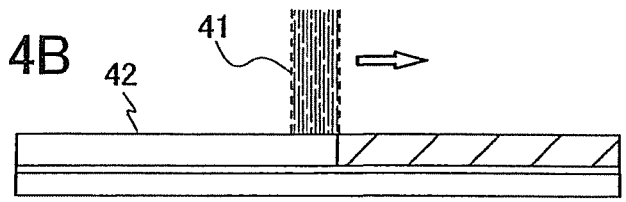

As a method of crystallizing the amorphous silicon film, there are a method of irradiating an amorphous silicon film with a laser beam 41 (FIG. 4B), a method of crystallizing an amorphous silicon film by heating using an element which promotes the crystallization of a semiconductor film, a method of crystallizing an amorphous silicon film by irradiation with light emitted from a lamp, or a combination of these methods. A method of thermally crystallizing an amorphous semiconductor film without using the element can also be used. However, such a method can be applied only in the case where the substrate is a quartz substrate or the like which can withstand the high temperature.

In the case of irradiation with laser light, a continuous-wave (CW) laser beam or a pulsed laser beam can be used. Here, a beam emitted from one or plural kinds of a gas laser such as an Ar laser, a Kr laser, or an excimer laser; a laser using, as a medium, single crystalline YAG; $YVO_4$, forsterite ($Mg_2SiO_4$), $YAlO_3$, or $GdVO_4$ or polycrystalline (ceramic) YAG $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser, can be used as the laser beam. By irradiation with a laser beam having a fundamental wave of such lasers or one of the second to fourth harmonics of these fundamental waves, a crystal with a large grain size can be obtained. For example, the second harmonic (532 nm) or the third harmonic (355 nm) of an Nd:$YVO_4$ laser (fundamental wave of 1064 nm) can be used. This laser can be emitted by either CW or pulsed oscillation. In the case of CW irradiation, a power density of about 0.01 MW/cm² to 100 MW/cm² (preferably, 0.1 MW/cm² to 10 MW/cm²) is required for the laser. The scanning rate is approximately set at about 10 cm/sec to 2000 cm/sec to irradiate the semiconductor film.

Note that each laser using, as a medium, single crystalline YAG YVO₄, forsterite (Mg₂SiO₄), YAlO₃, or GdVO₄ or polycrystalline (ceramic) YAG, Y₂O₃, YVO₄, YAlO₃, or GdVO₄ doped with one or more of Nd, Yb, Cr, Ti, Ho, Er, Tm, and Ta as a dopant; an Ar ion laser; and a Ti: sapphire laser, is capable of continuous oscillation. Further, pulse oscillation thereof can be performed at a repetition rate of 10 MHz or more by carrying out Q switch operation or mode synchronization. When a laser beam is emitted at a repetition rate of 10 MHz or more, a semiconductor film is irradiated with a next pulse while the semiconductor film is melted by the laser beam and then solidified. Therefore, unlike the case of using a pulsed laser with a low repetition rate, a solid-liquid interface can be continuously moved in the semiconductor film so that crystal grains, which continuously grow in a scanning direction, can be obtained.

When ceramic (polycrystal) is used as a medium, the medium can be formed to have a free shape for a short time at low cost. When using a single crystal, a columnar medium with several mm in diameter and several tens of mm in length is usually used. In the case of using the ceramic, a medium bigger than the case of using the single crystal can be formed.

A concentration of a dopant such as Nd or Yb in a medium, which directly contributes to light emission, can be changed largely neither in the single crystal nor in the polycrystal; therefore, there is some limitation on improvement in output of a laser by increasing the concentration of the dopant. However, in the case of a ceramic, the size of a medium can be significantly increased as compared with the case of the single crystal; thus, drastic improvement in output of a laser can be realized.

Further, in the case of a ceramic, a medium with a parallelepiped shape or a rectangular parallelepiped shape can be formed easily. In a case of using a medium having such a shape, when oscillated light is made travel in a zigzag manner inside the medium, a path of the oscillated light can be made long. Therefore, amplification is increased and a laser beam can be oscillated at high output. Furthermore, a cross section of a laser beam emitted from a medium having such a shape has a quadrangular shape, which is advantageous when the laser beam is shaped into a linear shape in cross section as compared with a laser beam with a circular shape. By shaping a laser beam emitted in the above described manner using an optical system, a linear beam having a length of 1 mm or less on a shorter side and a length of several mm to several m on a longer side can be easily obtained. In addition, when a medium is uniformly irradiated with excited light, energy distribution of a linear beam is uniform in a longer side direction.

When a semiconductor film is irradiated with this linear beam, the whole surface of the semiconductor film can be annealed more uniformly. In a case where uniform annealing is required from one end to the other end of the linear beam, for example, an arrangement in which slits are provided in either end of the linear beam is required, thereby shielding light at a portion where energy is attenuated.

When a semiconductor film is annealed using the thus obtained linear beam having uniform intensity and an electronic device is manufactured by using this semiconductor film, characteristics of the electronic device are good and uniform.

A method of crystallizing the semiconductor film by heating with an element which promotes the crystallization of the semiconductor film is described here.

Figure 4C:
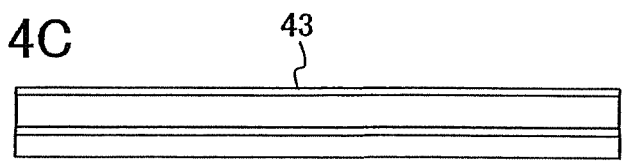
Figure 4D:
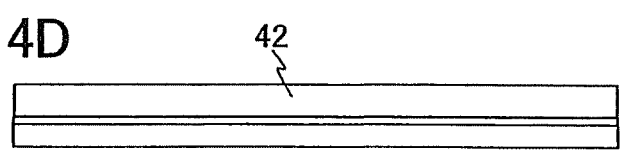

An element 43 which promotes the crystallization is added to an amorphous silicon film (FIG. 4C), and then heat treatment is carried out, so that the amorphous silicon film is crystallized with the added region as a nucleus (FIG. 4D).

An amorphous silicon film can also be crystallized by performing irradiation with strong light instead of the heat treatment. In that case, any one of or a combination of infrared light, visible light, and ultraviolet light can be used. Typically, light emitted from a halogen lamp, a metal halide lamp, a xenon arc lamp, a carbon arc lamp, a high pressure sodium lamp, or a high pressure mercury lamp is used. The lamp light source is lighted for 1 to 60 seconds, or preferably 30 to 60 seconds, and such lighting is repeated 1 to 10 times, or preferably 2 to 6 times. The light-emission intensity of the lamp light source is arbitrary, but the silicon film is instantaneously heated up to about 600° C. to 1000° C. Note that if necessary, thermal treatment may be performed in order to discharge the hydrogen contained in the semiconductor film 40 containing an amorphous silicon film having an amorphous structure before the irradiation with the strong light. Alternatively, crystallization may be performed by both the heat treatment and irradiation with strong light.

After the heat treatment, in order to increase the crystallization rate of the crystalline silicon film 42 (rate of volume occupied by crystalline components against the whole volume of the film) and to correct defects which remain in the crystalline grains, the crystalline silicon film may be irradiated with the laser beam in the atmospheric air or an oxygen atmosphere. The laser beam may be selected from the aforementioned ones.

In the case of forming the crystalline silicon film by the above method, the element which promotes crystallization contained in the crystalline silicon film 42 is required to be removed. The method is described below.

Figure 4E:
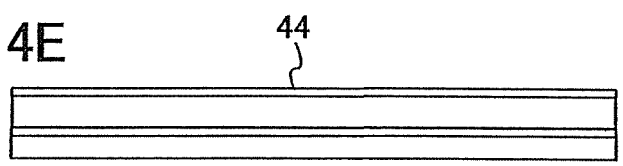

First, the surface of the crystalline silicon film is treated with a solution containing ozone (typically, ozone water), thereby forming a barrier layer 44 formed from an oxide film (called chemical oxide) on the surface of the crystalline silicon film to a thickness of 1 nm to 10 nm (FIG. 4E). The barrier layer 44 functions as an etching stopper when only a gettering layer is selectively removed in a later step.

Figure 4F:
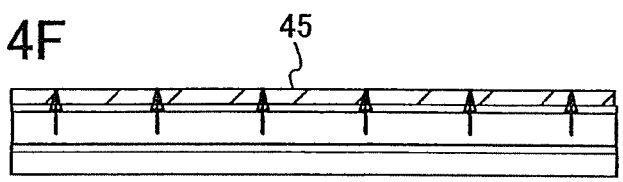

Then, a gettering layer containing a rare gas element is formed as a gettering site over the bather layer 44. Here, a semiconductor film containing a rare gas element is formed as the gettering layer 45 by a CVD method or a sputtering method (FIG. 4F). When forming the gettering layer, the sputtering conditions are controlled as appropriate so that a rare gas element is added thereto. The rare gas element may be one or more of helium (He), neon (Ne), argon (Ar), krypton (Kr), or xenon (Xe).

Note that in the case of forming the gettering layer by using a feed gas containing phosphorus which is an impurity element having one conductivity type or using a target including phosphorus, gettering can be performed by utilizing the coulomb force of phosphorus in addition to the gettering using the rare gas element. In gettering, a metal element (e.g., nickel) tends to move to a region having a high concentration of oxygen; therefore, the concentration of oxygen contained in the gettering layer 45 is desirably set at $5 \times 10^{18}/cm^3$ or higher, for example.

Next, the crystalline silicon film; the barrier layer and the gettering layer is subjected to thermal treatment (e.g., heat treatment or irradiation with strong light), thereby the metal element (e.g., nickel) is gettered as shown by arrows in FIG.

4F so that the metal element in the crystalline silicon film is lowered in concentration. Alternatively, the metal element in the crystalline silicon film is removed.

Figure 4G:
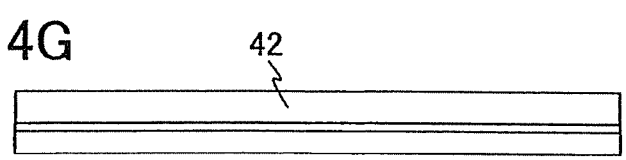

Then, a known etching method is performed using the barrier layer 44 as an etching stopper; thereby only the gettering layer 45 is selectively removed. After that, the barrier layer 44 formed from an oxide film is removed, for example, using an etchant containing hydrofluoric acid (FIG. 4G).

The crystalline silicon film 42 can be formed through the above steps.

Here, impurity ions may be added in consideration of threshold characteristics of a semiconductor device to be manufactured.

Figure 5A:
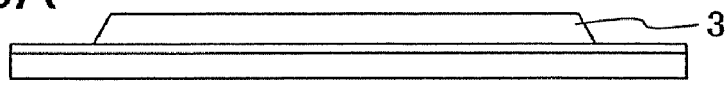
FIGS. 5A to 5E are diagrams illustrating a manufacturing process of a semiconductor device according to the present invention.

Next, the crystalline silicon film 42 is formed into an island shape by a known photolithography process (FIG. 5A). At this time, a side wall of the semiconductor film 3 containing island-shaped crystalline silicon desirably has a tapered shape.

Figure 5B:
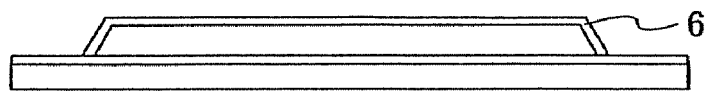

Then, after cleaning the surface of the semiconductor film 3 containing a silicon film with an etchant containing hydrofluoric acid, a first gate insulating film 6 is formed to a thickness of 5 to 20 nm over the semiconductor film 3 containing a silicon film (FIG. 5B). The surface cleaning and the formation of the first gate insulating film 6 may be continuously carried out without exposure to the atmosphere.

Here, the first gate insulating film 6 containing silicon oxide is formed by oxidizing a surface of the semiconductor film 3 including a silicon film by using high density plasma (FIG. 5B). High density plasma is produced by using a micro wave of high frequency, for example, 2.45 GHz. Such high density plasma is used, and oxygen (or a gas containing oxygen) is activated by plasma activation, and these are reacted with silicon directly to insulate the surface of the semiconductor film 3 including a silicon film.

High density plasma of which density of electron is $10^{11}$ cm$^{-3}$ or more, and an electron temperature is in a range of 0.2 to 2.0 eV, inclusive (more preferably, in a range of 0.5 to 1.5 eV, inclusive) is used. Such high density plasma which is characterized a low electron temperature can form a film which is less damaged by plasma and has almost no defects than conventional plasma treatment since kinetic energy of active species is low. In addition, this insulating film is denser than an insulating film which is formed by using an anodic oxidation method.

Figure 6:
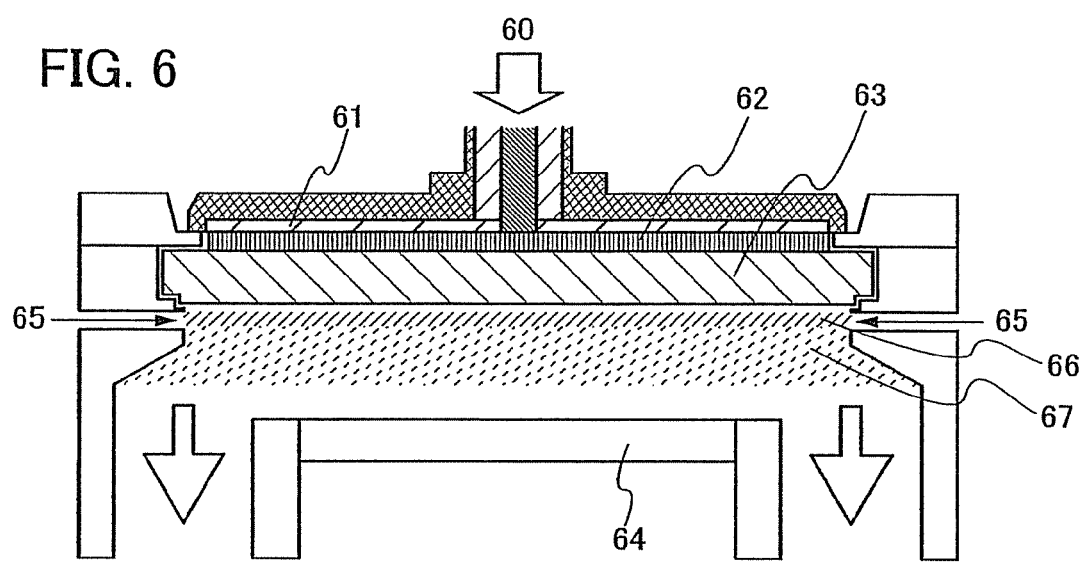
FIG. 6 is a diagram illustrating high density plasma treatment apparatus.

For example, the above high density plasma treatment is performed using an apparatus of FIG. 6. Reference numeral 61 is a dielectric waveguide, 62 is a slot antenna having plural slots, 63 is a dielectric substrate which is made of quartz or aluminum oxide, and 64 is a stage for installing a substrate. The stage 64 has a heater. A micro wave is transmitted from 60, and a gas which is supplied from directions of arrows 65 in a plasma generating region 66 is activated. A position and a length of the slot in the slot antenna 62 are selected appropriately depending on a wave length of the micro wave transmitted from 60. In addition, gas is exhausted in the directions of the arrows.

By using such an apparatus, plasma with uniformity, highly density, and a low electron temperature can be excited, and a low temperature treatment (a substrate temperature of 400° C. or less) can be achieved. Note that plastics, which are thought to have low heat resistance generally, can be used as a substrate.

Note that as a gas to be supplied, an inert gas such as argon, krypton, helium, or xenon is contained in oxygen (or gas including oxygen) or nitrogen (or gas including nitrogen). Therefore, these inert elements are mixed into the gate insulating film formed by high density plasma oxidation or nitriding processing.

Further, an activated gas which is more uniform can be supplied to a processing object by providing a shower plate in a device inside 67.

Figure 5C:
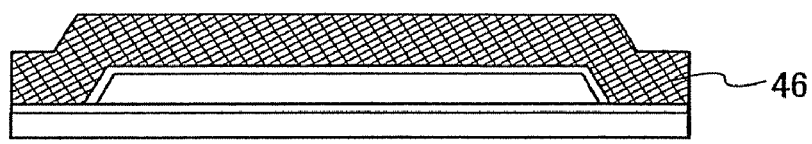

Next, tungsten (W) is formed with a thickness of 100 to 600 nm by a sputtering method as a conductive film 46 which forms a floating gate electrode over the whole surface including the first gate insulating film 6 (FIG. 5C).

Figure 5D:
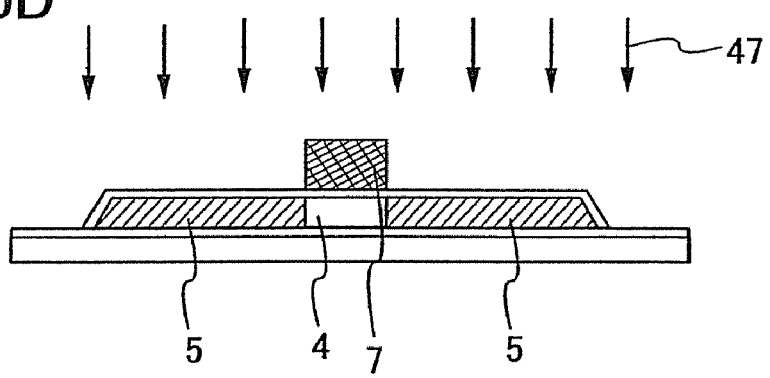

A photoresist film is applied over the conductive film 46, and this photoresist film is exposed and developed to form a resist mask. The conductive film 46 is etched by using this resist mask, so that the floating gate electrode 7 is formed over the first gate insulating film 6 (FIG. 5D). Then, the resist mask is removed.

N-type or p-type impurities 47 are introduced into the semiconductor film 3 by using the floating gate electrode 7 as a mask, so that the source or drain region 5 is formed.

Here, heat treatment, irradiation with light such as laser light or strong light, RTA treatment may be performed so as to activate the source or drain region.

The second gate insulating film 8 is formed with a thickness of 10 to 250 nm by using a silicon oxide film or the like to cover the floating gate electrode 7. A known CVD method or the like is used as a film formation method.

A conductive film 49 for forming a control gate electrode is formed with a thickness of 100 to 500 nm over the second gate insulating film 8. Here, a TaN film is formed and a W film is formed by a sputtering method to form a two-layer structure.

Figure 5E:
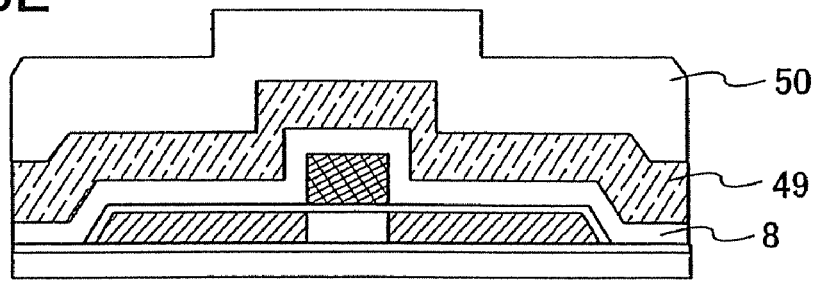

An insulating film 50 for forming a sidewall 10 is formed with a thickness of 100 to 900 nm by using a silicon oxynitride film, a silicon oxide film, or the like over the conductive film 49 (FIG. 5E).

Figure 7A:
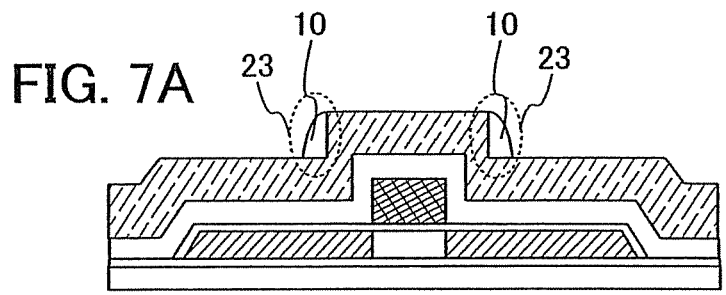
FIGS. 7A to 7D are diagrams illustrating a manufacturing process of a semiconductor device according to the present invention.

Then, the insulating film 50 is subjected to anisotropic etching. Accordingly, the sidewall 10 is formed in a self-aligned manner on the stepped portion 23 generated in the conductive film 49 by the existence of the floating gate electrode 7 (FIG. 7A). The sidewalls 10 formed on the stepped portions 23 are naturally formed at symmetrical positions or nearly symmetrical positions mainly with respect to the floating gate electrode 7. The two sidewalls 10 are formed in positions where respective lengths 57 are the same or almost the same from edge portions of the floating gate electrode 7 in the gate length direction.

Figure 7B:
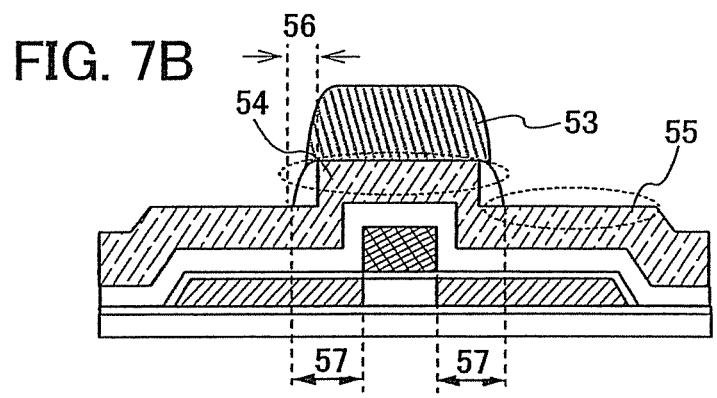

Next, a resist mask 53 is formed over the conductive film 49 (FIG. 7B). The conductive film 49 includes an upper step portion 54 and a lower step portion 55 due to the floating gate electrode 7. Here, the resist mask 53 is formed so as to cover the top portion of the conductive film 49, namely the whole surface of the upper step portion, and not to cover the lower step portion.

In general, in the case of forming a resist mask by a photolithography technique, it is difficult to form a resist mask at a desired position properly since misalignment occurs. When the resist mask 53 is also formed, there is a possibility of generating misalignment by the photolithography technique. Accordingly, a length 56 (length of the gate length direction) of the sidewall 10 is required to be a length with which misalignment and variation of a resist dimension are acceptable. Therefore, the resist mask 53 is provided over the sidewalls 10 in some cases. Accordingly, the resist mask 53 is provided so as to cover only the entire upper step portion of the conductive film 49 and the sidewalls 10.

Figure 7C:
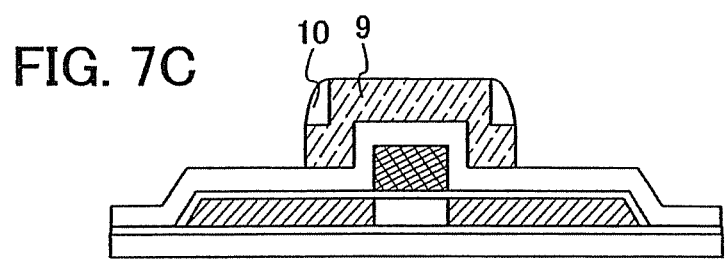

The control gate electrode 9 can be formed in a self-aligned manner with respect to the floating gate electrode 7 by etching the conductive film 49 by using the resist mask 53 and the sidewalls 10 as a mask. Next, the resist mask 53 is removed (FIG. 7C). As described above, the sidewalls 10 are formed at symmetrical positions or nearly symmetrical positions mainly with respect to the floating gate electrode 7. The sidewalls 10 are formed in positions where the respective lengths 57 are the same or almost the same from the edge portions of the floating gate electrode 7 in the gate length direction. Accordingly, a length and an area of a region in which the control gate electrode 9 and one of the source and drain regions overlap each other can be equal to or almost equal to a length and an area of a region in which the control gate electrode 9 and the other of the source and drain regions overlap each other. By using the manufacturing method as described above, the control gate electrode 9 can be formed at a desired position properly without generating misalignment.

Figure 9A:
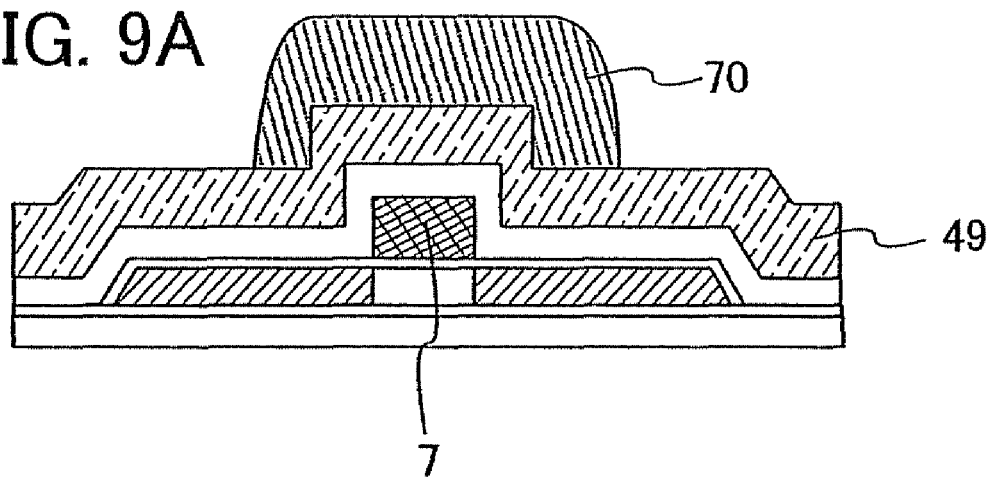
FIGS. 9A and 9B are diagrams illustrating a conventional manufacturing process.
Figure 9B:
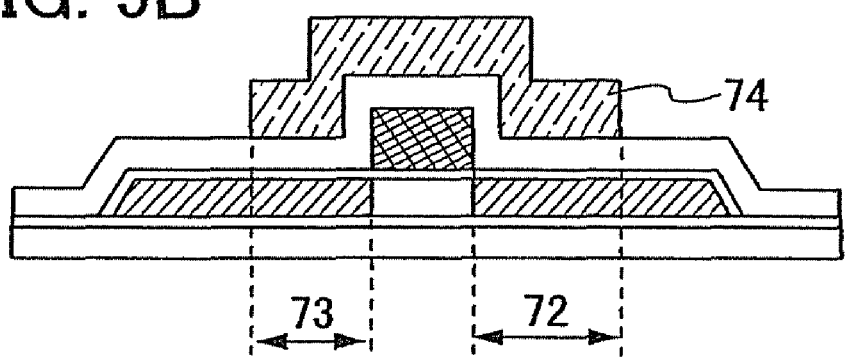

On the other hand, a case where a resist mask is formed over the conductive film 49 without forming the sidewall 10, and etched to form the control gate electrode 9 is described with reference to FIGS. 9A and 9B.

As described above, it is difficult to form a resist mask properly at a desired position, because misalignment is generated in the formation of the resist mask. Therefore, a resist mask 70 is not formed so as to be symmetrical or nearly symmetrical mainly with respect to the floating gate electrode 7, and the end portions of the resist mask 70 are formed in a position having different lengths from the edge portions of the floating gate electrode 7 in the gate length direction (FIG. 9A).

When the conductive film 49 is etched by using the resist mask 70, a length 72 of a region in which a control gate electrode 74 and one of source and drain regions overlap each other is quite different from a length 73 of a region in which the control gate electrode 74 and the other of the source and drain regions overlap each other. In addition, the areas of the regions are naturally different (FIG. 9B).

Hereinafter, a manufacturing process after FIG. 7C is described.

The insulating film 13 is formed over the whole surface including the second gate insulating film 8, the control gate electrode 9, and the sidewalls 10, and hydrogenaration is performed. A silicon nitride film, a silicon oxynitride film, or a silicon nitride oxide film can be used as the insulating film 13. In the case where activation or the like described earlier is not performed, heat treatment, irradiation with light such as laser light or strong light, RTA treatment may be performed so as to activate the source or drain region in this stage.

Next, a resist mask is formed over the insulating film 13, and the insulating film 13 is etched by using this resist mask. Thus, contact holes located over the source and drain regions 5 and the control gate electrode 9 are formed.

Figure 7D:
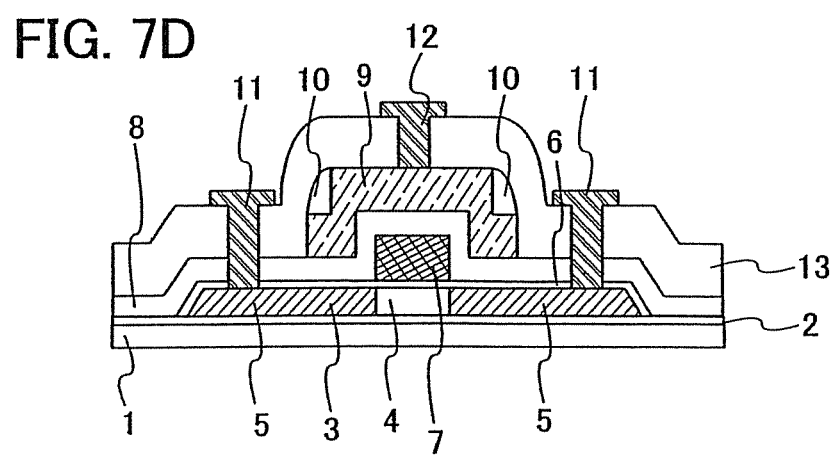

After the resist mask is removed and a conductive film is formed, etching is performed by using another resist mask, thereby forming a source electrode, a drain electrode, a gate wire, or another wire (source wire or the like) (FIG. 7D). Although the electrode and the wire are integrally formed here, the electrode and the wire may be separately formed and connected electrically. As the conductive film, Ti, TiN, Al, an Al alloy film, or a stacked-layer film by combining them can be used.

Here, the electrode or the wire is preferably led so as to have a round corner when the substrate 1 is seen from a perpendicular direction (that is, a top surface direction). By making the corners round, dust or the like can be prevented from remaining at the corners of the wire; thus, defects caused by dust can be reduced and the yield can be improved.

When the source or drain region 5 is formed by the manufacturing method described above, n-type or p-type impurities are added once; however, an LDD region may be formed by adding n-type or p-type impurities plural times. This manufacturing method is described below.

N-type or p-type impurities are added in the state of FIG. 5D in order to form a low concentration impurity region. And after forming the second gate insulating film 8, the sidewalls 10, and the control gate 9, n-type or p-type impurities 59 are added in the state of FIG. 7C (FIG. 8A). The n-type or p-type impurities 59 provide the same conductivity as the n-type or p-type impurities 47. Accordingly, the n-type or p-type impurities 59 are not added to portions over which the control gate electrode 9 is formed and the portions become second impurity regions 34 which are LDD regions. On the other hand, portions over which the control gate electrode 9 is not formed become high concentration impurity regions, namely source and drain regions. Accordingly, a structure shown in FIG. 8B can be formed. Note that this embodiment mode can be implemented freely combining with the aforementioned embodiment modes.

(Embodiment Mode 4)

A method of manufacturing the semiconductor device described in Embodiment Mode 2, namely the semiconductor device shown in FIGS. 2A to 2D is described. However, a part of a manufacturing method described here is similar to that described in Embodiment Mode 3. Therefore, a step different from Embodiment Mode 3, a step of forming the floating gate electrode 7, and a step of forming a first impurity region or the like are described here.

Figure 10A:
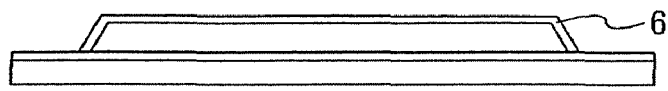
FIGS. 10A to 10E are diagrams illustrating a manufacturing process of a semiconductor device according to the present invention.

After the first gate insulating film 6 is formed over the semiconductor film 3 (FIG. 10A), a first conductive layer 91 is formed, and a second conductive layer 92 is formed over the first conductive layer 91. The first conductive layer 91 and the second conductive layer 92 are preferably formed of different conductive materials. The first conductive layer 91 is preferably formed of a conductive material of which adhesiveness to the first gate insulating film 6 is high, and for example, titanium nitride (TiN), tantalum nitride (TaN), titanium (Ti), tantalum (Ta), tungsten (W), silicon (Si), or the like is preferably used. The first conductive layer is preferably formed with a thickness in the range of 25 to 35 nm.

The second conductive layer 92 is preferably formed of a conductive material of which resistivity is low, and for example, tungsten (W), molybdenum (Mo), aluminum (Al), or copper (Cu), an alloy of the material as a main component, a metal compound, or the like is preferably used. As the alloy, there am an alloy of aluminum and silicon, an alloy of aluminum and neodymium, and the like. As the metal compound, there are tungsten nitride, and the like. The second conductive layer is preferably formed with a thickness in the range of 100 to 600 nm.

Figure 10B:
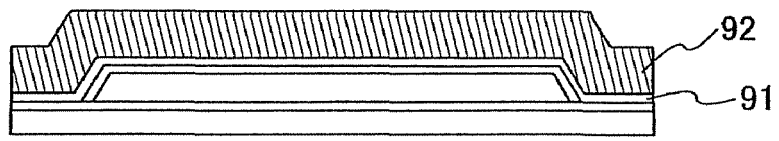

A method of forming the first conductive layer 91 and the second conductive layer 92 is not particularly limited, and any method such as a sputtering method or an evaporation method may be used. In this embodiment mode, tantalum nitride is used for the first conductive layer 91 and tungsten is used for the second conductive layer 92 (FIG. 10B).

Figure 10C:
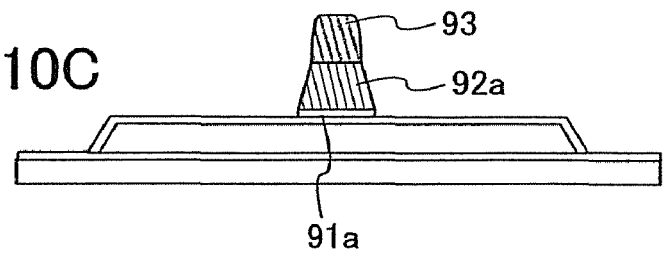

Next, a mask 93 is formed over the second conductive layer 92. Then, the first conductive layer 91 and the second conductive layer 92 are etched, and a first conductive layer 91a and a second conductive layer 92a are formed so that side walls of the respective conductive layers have an inclination with respect to horizontal-planes of the respective conductive layers (FIG. 10C).

Figure 10D:
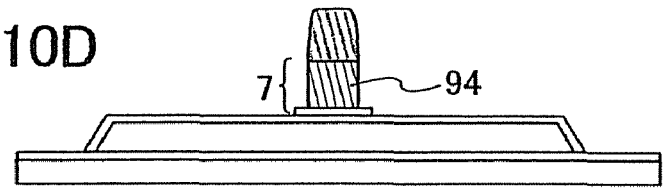

Next, with the mask 93 maintained, the second conductive layer 92a is selectively etched to form a second conductive layer 94. At this time, it is preferable that etching be carried out under a condition with a high anisotropic property so that a side wall of the second conductive layer 94 is perpendicular to a horizontal-plane. Accordingly, the inclined portion of the side wall of the second conductive layer 92a is removed. In this manner, the second conductive layer 94 having a shorter width than the first conductive layer 91a (that is the gate length is short) is formed over the first conductive layer 91a, so that the floating gate electrode 7, which is structured by the first conductive layer 91a and the second conductive layer 94, can be formed (FIG. 10D).

Figure 10E:
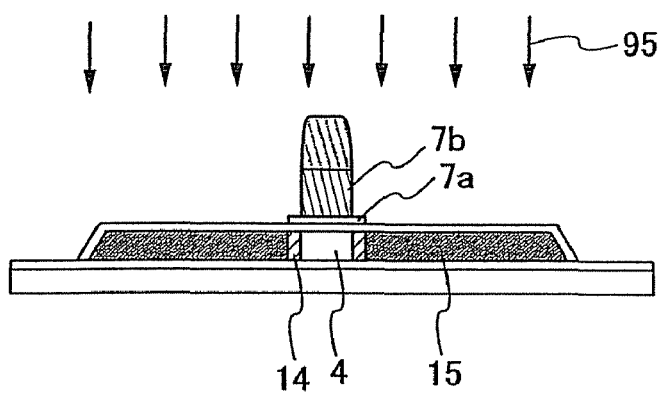

Next, n-type or p-type impurities 95 are added by using the floating gate electrode 7 as a mask, and the first impurity regions 15 and the second impurity regions 14 are provided (FIG. 10E). The second impurity regions 14 are low concentration impurity regions by the first floating gate electrode 7a.

After the structure of FIG. 10E is formed, the second gate insulating film is formed, the sidewall 10 is formed, the control gate electrode 9 is formed, the insulating film 13 is formed, and the source or drain electrode 11 and the gate wire 12 are formed by the method described in Embodiment Mode 3, thereby completing the structure shown in FIG. 2A.

Hereinafter, a method of forming the third impurity region as shown in FIG. 2D is described.

Figure 11A:
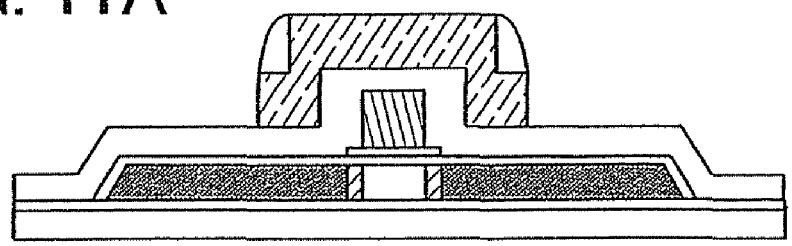
FIGS. 11A and 11B are diagrams illustrating a manufacturing process of a semiconductor device according to the present invention.

The structure of FIG. 10E is formed, the second gate insulating film is formed, the sidewall 10 is formed, and the control gate electrode 9 is formed by the method described in Embodiment Mode 3 (FIG. 11A).

Figure 11B:
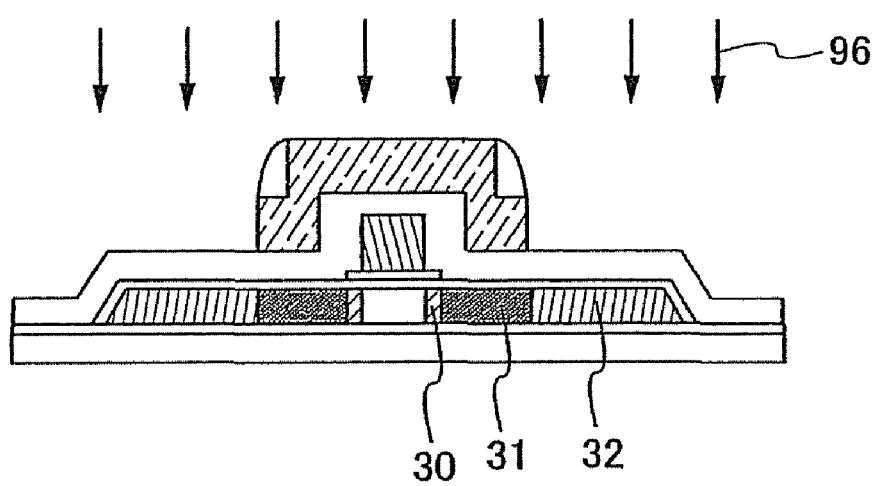
Figure 12A:
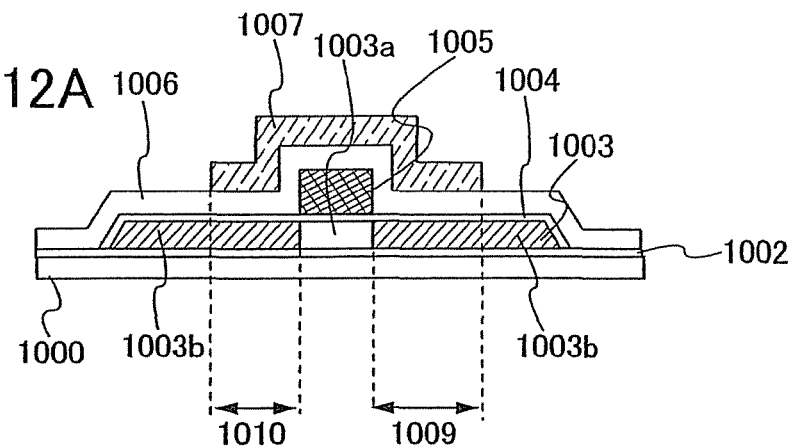
FIGS. 12A to 12D are diagrams illustrating a conventional example.
Figure 12B:
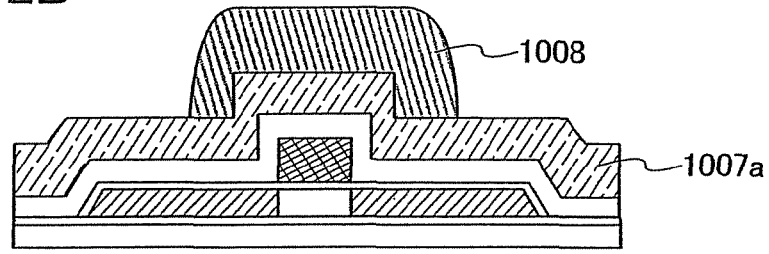
Figure 12C:
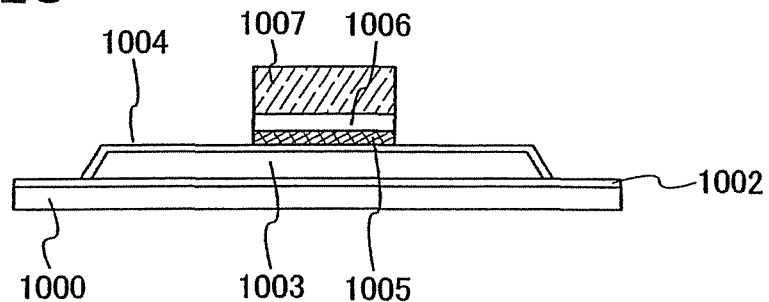
Figure 12D:
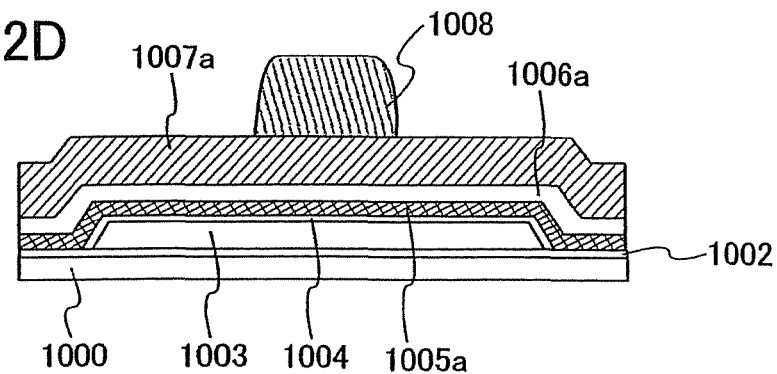

Next, n-type or p-type impurities 96 are added. The n-type or p-type impurities 96 provide the same conductivity as the n-type or p-type impurities 95. The n-type or p-type impurities 96 are not added under the control gate electrode 9, so that the first impurity regions 32, the second impurity regions 30, and the third impurity regions 31 can be formed (FIG. 11B). In this case, an n-type or p-type impurity concentration contained in the first impurity regions 32 is higher than an n-type or p-type impurity concentration contained in the third impurity regions 31, and the n-type or p-type impurity concentration contained in the third impurity regions 31 is higher than an n-type or p-type impurity concentration contained in the second impurity regions 30.

The insulating film 13 is formed, the source or drain electrode 11, and the gate wire 12 are formed, thereby completing the structure shown in FIG. 2D. Note that this embodiment mode can be implemented freely combining with the aforementioned embodiment modes.

(Embodiment Mode 5)

A method, using the present invention, of forming a semiconductor device which can exchange data by non-contact, for example, an IC tag or an RFID, is described here. First, a release layer 101 is formed on one surface of a substrate 100 (FIG. 13A). The substrate 100 is formed of a glass substrate, a quartz substrate, a metal substrate or a stainless substrate over one surface of which an insulating layer is formed, a plastic substrate which is resistant to the processing temperature of this step, or the like. There is no particular limitation on the size or the shape of such a substrate. Therefore, as the substrate 100, for example, when a substrate which has a rectangular shape with a length of one meter or more on a side is used, the productivity can be drastically improved. Such an advantage is a far superior point to the case where a wireless chip is taken from a circular silicon substrate Note that in this step, although the release layer 101 is provided over the entire surface of the substrate 100, the release layer 101 may be selectively provided by a photolithography method after being provided over the entire surface of the substrate 100. In addition, although the release layer 101 is formed so as to be in contact with the substrate 100, an insulating film which is to be a base may be formed so as to be in contact with the substrate 100, and the release layer 101 may be formed so as to be in contact with the insulating film as appropriate.

The release layer 101 is formed with a single layer or a multi-layer by a known method (e.g., a sputtering method or a plasma CVD method) using an element selected from tungsten (W), molybdenum (Mo), titanium (Ti), tantalum (Ta), niobium (Nb), nickel (Ni), cobalt (Co), zirconium (Zr), zinc (Zr), ruthenium (Ru), rhodium (Rh), lead (Pd), osmium (Os), iridium (Ir), or silicon (Si), or an alloy material or compound material containing such elements as a main component. A layer containing silicon may have any of an amorphous structure, a microcrystalline structure and a polycrystalline structure.

If the release layer 101 has a single-layer structure, it is preferably, formed using a tungsten layer, a molybdenum layer, or a layer containing a mixture of tungsten and molybdenum. Alternatively, the release layer 101 is formed using a layer containing oxide of tungsten, a layer containing a tungsten oxynitride, a layer containing molybdenum oxide, a layer containing molybdenum oxynitride, or a layer containing oxide or oxynitride of a mixture of tungsten and molybdenum. Note that the mixture of tungsten and molybdenum corresponds, for example, to an alloy of tungsten and molybdenum. In addition, oxide of tungsten is referred to as tungsten oxide in some cases.

If the release layer 101 has a stacked structure, preferably, a first layer thereof is formed of a tungsten layer, a molybdenum layer, or a layer containing a mixture of tungsten and molybdenum, and a second layer thereof is formed of oxide, nitride, oxynitride or nitride oxide of tungsten, molybdenum, or a mixture of tungsten and molybdenum.

In the case where the release layer 101 is formed with a stacked structure of a layer containing tungsten and a layer containing tungsten oxide thereover, the layer containing tungsten may be formed first and a silicon oxide layer may be formed thereon so that a tungsten oxide layer is formed at the interface between the tungsten layer and the silicon oxide layer. This also applies to the case of forming a layer containing nitride, oxynitride or nitride oxide of tungsten. For example, after forming a tungsten layer, a silicon nitride layer, a silicon oxynitride layer, or a silicon nitride oxide layer is formed thereover. Note that the silicon oxide layer, the silicon oxynitride layer, the silicon nitride oxide layer or the like which is formed over the tungsten layer serves as a base insulating layer later.

The tungsten oxide is denoted by $WO_x$, where x is 2 to 3. There are cases where x is 2 (the oxide is $WO_2$), x is 2.5 (the oxide is $W_2O_5$), x is 2.75 (the oxide is $W_4O_{11}$), x is 3 (the oxide is $WO_3$), and the like. In forming the oxide of tungsten, the x value is not specifically limited to a certain value, and it may be determined based on the etching rate or the like. Note that a layer containing tungsten oxide which is formed by a sputtering method in an oxygen atmosphere has the best etching rate ($WO_x$, $0<x<3$). Thus, in order to reduce manufacturing time, the release layer is preferably formed using a layer containing tungsten oxide by a sputtering method in an oxygen atmosphere.

Then, a base insulating film 102 to be a base is formed so as to cover the release layer 101. The insulating film to be a base is formed with a single layer or a multi-layer by a known method (e.g., a sputtering method or a plasma CVD method) using a layer containing oxide of silicon or a layer containing nitride of silicon. The silicon oxide material is a substance containing silicon (Si) and oxygen (O), which corresponds to silicon oxide, silicon oxynitride, silicon nitride oxide, or the like. The silicon nitride material is a substance containing silicon and nitrogen (N), which corresponds to silicon nitride, silicon oxynitride, silicon nitride oxide, or the like.

Next, over the insulating film 102, an amorphous semiconductor film 103 (e.g., an amorphous silicon film) is formed. The amorphous semiconductor film 103 is formed with a thickness of 25 to 200 nm (preferably, 30 to 150 nm) by a sputtering method, an LPCVD method, a plasma CVD method, or the like. Subsequently, the amorphous semiconductor film 103 is crystallized by a laser crystallization method, a thermal crystallization method using RTA or an annealing furnace, a thermal crystallization method using a metal element which promotes crystallization, a method combining a laser crystallization method and a thermal crystallization method using a metal element which promotes crystallization, or the like to form a crystalline semiconductor film. Then, the obtained crystalline semiconductor film is shaped into a desired shape, so that crystalline semiconductor films 103a to 103f are formed (FIG. 13B). The crystalline semiconductor film 103a forms a p-channel thin film transistor of a logic circuit portion, and the crystalline semiconductor film 103b forms an n-channel thin film transistor of the logic circuit portion. The crystalline semiconductor films 103c and 103d each form a semiconductor memory device. The crystalline semiconductor film 103e forms an n-channel thin film transistor with high withstand voltage which is formed in a power supply portion generated by an antenna. Either an n-channel thin film transistor or a p-channel thin film transistor may be used as the thin film transistor having high withstand voltage which is provided in the crystalline semiconductor film 103e. Here, an example in which the crystalline semiconductor film 103e forms an n-channel thin film transistor with high withstand voltage is described.

Next, first gate insulating films 104a to 104e to cover the crystalline semiconductor films 103a to 103e are formed. The crystalline semiconductor film is subjected to high density plasma oxidation treatment to form an oxide film with a thickness of 8 to 20 nm, thereby forming the first gate insulating films 104a to 104e (FIG. 13B). Then, the first gate insulating films 104a to 104e may be subjected to high density plasma nitriding treatment or plasma CVD to stack a nitride film.

Next, a first conductive film and a second conductive film are stacked over the first gate insulating films 104a to 104e. The first conductive film is formed with a thickness of 25 to 35 nm by a plasma CVD method or a sputtering method. The second conductive film is formed with a thickness of 100 to 600 nm. The first conductive film and the second conductive film are formed of an element selected from tantalum (Ta), tungsten (W), titanium (Ti), molybdenum (Mo), aluminum (Al), copper (Cu), chromium (Cr), niobium (Nb) or the like, or an alloy material or a compound material containing the above-described element as a main component. Alternatively, they may be formed of a semiconductor material represented by polycrystalline silicon added with an impurity element such as phosphorus. As examples of a combination of the first conductive film and the second conductive film, there are a tantalum nitride (TaN) film and a tungsten (W) film, a tungsten nitride (WN) film and a tungsten film, a molybdenum nitride (MoN) film and a molybdenum (Mo) film, and the like. Since tungsten and tantalum nitride have high heat resistance, heat treatment for thermal activation can be performed after the first conductive film and the second conductive film are formed.

Next, a resist mask is formed by a photolithography method, and etching treatment is performed to the first conductive film and the second conductive film, so that first gate electrodes 105a and 105b each for a logic TFT and floating gate electrodes 105c and 105d are formed (FIG. 13C).

Next, a resist mask 108 is formed by a photolithography method, and n-type impurities are added at a low concentration to the crystalline semiconductor films 103b, 103c, and 103d, by an ion doping method or an ion implantation method, so that n-type impurity regions 107b, 107c, and 107d, and channel-forming regions 201b, 201c, and 201d are formed (FIG. 14A). Then, the resist mask 108 is removed.

Next, a second gate insulating film 109 is formed. A silicon oxide film, a silicon oxynitride film, a silicon nitride oxide film, or the like can be used by a CVD method or a sputtering method. Either a stacked-layer film or a single layer may be used.

Next a conductive film 110 for forming a control gate electrode is formed. The conductive film 110 can be formed of the material which has been described for the conductive film for forming the floating gate electrode.

A layer 111 is formed over the conductive film 110 (FIG. 14B). Here, the layer 111 can be formed as an insulating film for forming a sidewall in a later step. As the insulating film, a silicon oxide film, a silicon oxynitride film, a silicon nitride oxide film, or the like can be used. In addition, the layer 111 may be a conductive film, and may be used as a part of a control gate electrode at this time. Then, anisotropic etching is performed to form sidewalls 113a to 113d on stepped portions of the conductive film 110. Note that in the crystalline semiconductor film 103e where a floating gate electrode is not formed, the stepped portion is not generated and the sidewall is not formed.

Next, a resist mask 112 is formed over the conductive film 110 (FIG. 14C). Here, the resist mask 112 is formed so as to cover the top portion of the conductive film 110, namely the whole surface of the upper step portion, and not to cover the lower step portion. The resist mask 112 may also be formed over the sidewalls 113a to 113d. In addition, the resist mask 112 for forming a gate electrode is formed over the crystalline semiconductor film 103e.

Next, by using the resist mask 112 and the sidewalls 113a to 113d as masks, etching is performed so that second gate electrodes 114a and 114b each for a logic TFT, control gate electrodes 114c and 114d, and a gate electrode 114e for a TFT with high withstand voltage are formed (FIG. 14D). Then, the resist mask 112 is removed.

The first gate electrode 105a and the second gate electrode 114a for a logic TFT are electrically connected to each other to form a TFT, and the first gate electrode 105b and the second gate electrode 114b for a logic TFT are electrically connected to each other to form a TFT, in a step of forming a wire.

In addition, the gate electrode 114e for a TFT with high withstand voltage becomes a gate electrode of a TFT in which a stacked-layer film of the first gate insulating film 104e and the second gate insulating film 109 is a gate insulating film. By using the stacked-layer film of the first gate insulating film 104e and the second gate insulating film 109 as the gate insulating film, withstand voltage of the gate insulating film becomes high, then withstand voltage between source and drain regions can be improved.

Next, a resist mask 116 is formed by a photolithography method, and p-type impurities 115 (e.g., boron ion) are added to the crystalline semiconductor film 103a at a high concentration, so that a p-type impurity region 117 and a channel forming region 201a are formed (FIG. 15A). Then, the resist mask 116 is removed.

Next, a resist mask 119 is formed by a photolithography method, and n-type impurities are added to the crystalline semiconductor films 103b, 103c, 103d, and 103e at a high concentration, so that n-type impurity regions and channel forming regions are formed (FIG. 15B). Accordingly, the resist mask 119 is removed. Therefore, a p-type impurity region 132 and a channel forming region 131 are formed in the crystalline semiconductor film 103a. An n-type low concentration impurity region 121, an n-type high concentration impurity region 120, and a channel forming region 122 are formed in the crystalline semiconductor film 103b. An n-type low concentration impurity region 124, an n-type high concentration impurity region 123, and a channel forming region 125 are formed in the crystalline semiconductor film 103c. A first n-type impurity region 127, a second n-type impurity region 126, and a channel forming region 128 are formed in the crystalline semiconductor film 103d. An n-type impurity region 129 and a channel forming region 130 are formed in the crystalline semiconductor film 103e.

Next, an insulating film 202 is formed so as to cover the second gate insulating film 109, the second gate electrodes 114a and 114b, the control gate electrodes 114c and 114d, the gate electrode 114e, and the sidewalls 113a to 113d. The insulating film 202 is formed with a single layer or a multi-layer using an inorganic material such as an oxide of silicon or a nitride of silicon, an organic material such as polyimide, polyamide, benzocyclobutene, acrylic, epoxy, or siloxane, or the like by a plasma CVD method, a sputtering method, an SOG method, a droplet discharge method, or the like or a combination of the methods. In addition, an oxazole resin can also be used, and for example, photosensitive polybenzoxazole can be used. The photosensitive polybenzoxazole has a low dielectric constant (a dielectric constant of 2.9 at 1 MHz at a room temperature), high heat resistance (a thermal decomposition temperature of 550° C. with the rise in a temperature of 5° C./min, which is measured by thermogravimetric analyzer (TGA)), and a low water absorption rate (0.3% at a room temperature in 24 hours). An oxazole resin which has a lower dielectric constant as compared to polyimide is suitable as an interlayer insulating film.

Note that before the insulating film 202 is formed or after one or more of thin films for forming the insulating film 202 is formed, heat treatment for recovering the crystallinity of the semiconductor film, for activating the impurity element which has been added to the semiconductor film, or for hydrogenating the semiconductor film is preferably performed. For the heat treatment, a thermal annealing method, a laser annealing method, an RTA method, or the like is preferably used.

Next, the insulating film 202, the first gate insulating films 104a to 104e, and the second gate insulating film 109 are etched by a photolithography method to form contact holes which expose the n-type high concentration impurity regions 120, 123, 126, and 129, and the p-type impurity region 132. At this time, the contact holes are formed so that the first gate electrode 105a and the second gate electrode 114a can be electrically connected to each other, and the first gate electrode 105b and the second gate electrode 114b can be electrically connected to each other. Subsequently, a conductive film is formed over the contact holes, and patterned to form conductive films 140 to 144 each functioning as a source wire or a drain wire. At this time, the first gate electrode 105a and the second gate electrode 114a for the logic circuit portion are electrically connected to each other to form a TFT of which one gate electrode is structured by the first gate electrode and the second gate electrode, and the first gate electrode 105b and the second gate electrode 114b for the logic circuit portion are electrically connected to each other to form a TFT of which one gate electrode is structured by the first gate electrode and the second gate electrode.

The conductive films 140 to 144 are formed as a single layer or a multi-layer using an element selected from titanium (Ti), aluminum (Al), and neodymium (Nd), or an alloy material or a compound material containing the above-described element as a main component by a plasma CVD method or a sputtering method. An alloy material containing aluminum as a main component corresponds to a material containing nickel whose main component is aluminum or an alloy material containing nickel and one or both of carbon and silicon whose main component is aluminum, for example. Each of the conductive films 140 to 144 preferably employs, for example, a stacked structure of a barrier film, an aluminum-silicon (Al—Si) film, and a barrier film, or a stacked structure of a barrier film, an aluminum-silicon (Al—Si) film, a titanium nitride (TiN) film and a barrier film.

Note that a barrier film corresponds to a thin film formed of titanium, a nitride of titanium, molybdenum, or a nitride of molybdenum. Aluminum and aluminum-silicon which have low resistance and are inexpensive are optimal materials for forming the conductive films 140 to 144. In addition, generation of a hillock of aluminum or aluminum-silicon can be prevented when upper and lower barrier films are provided. Furthermore, when the barrier film is formed of titanium that is a highly-reducible element, even if a thin natural oxide film is formed over the crystalline semiconductor film, the natural oxide film is reduced so that preferable contact with the crystalline semiconductor film can be obtained.

Through the above steps, a p-channel TFT 210 and an n-channel TFT 211 included in the logic circuit portion, semiconductor memory devices 212 and 213 included in a semiconductor memory device portion, and an n-channel TFT 214 having high withstand voltage are completed.

Next, an insulating layer 145 is formed so as to cover the insulating film 202 and the conductive films 140 to 144. The insulating layer 145 is formed with a single layer or a multi-layer using an inorganic material or an organic material by a known method (e.g., an SOG method or a droplet discharge method). The insulating layer 145 is preferably formed with a thickness of 0.75 to 3 μm. Subsequently, the insulating layer 145 is etched by a photolithography method, so that a contact hole to expose the conductive film 144 is formed. Subsequently, a conductive film is formed over the contact hole, and patterned to form a wire 146 connected to a conductive film which is formed in a later step.

Next, a conductive film 147 functioning as an antenna which is in contact with the conductive film 146 is formed (FIG. 15C). The conductive film 147 is formed by a plasma CVD method, a sputtering method, a printing method, or a droplet discharge method using a conductive material. Preferably, the conductive film 147 is formed with a single layer or a multi-layer using an element selected from aluminum (Al), silver (Ag), copper (Cu), titanium (Ti), or an alloy material or a compound material containing the above-described element as a main component. Specifically, the conductive film 147 is formed by screen printing using a paste containing silver followed by heat treatment at 50° C. to 350° C. Alternatively, an aluminum film is formed by a sputtering method, and is patterned to form the conductive film 147. The aluminum film is preferably patterned by wet etching, and heat treatment at 200° C. to 300° C. is preferably conducted after the wet etching.

Figure 16A:
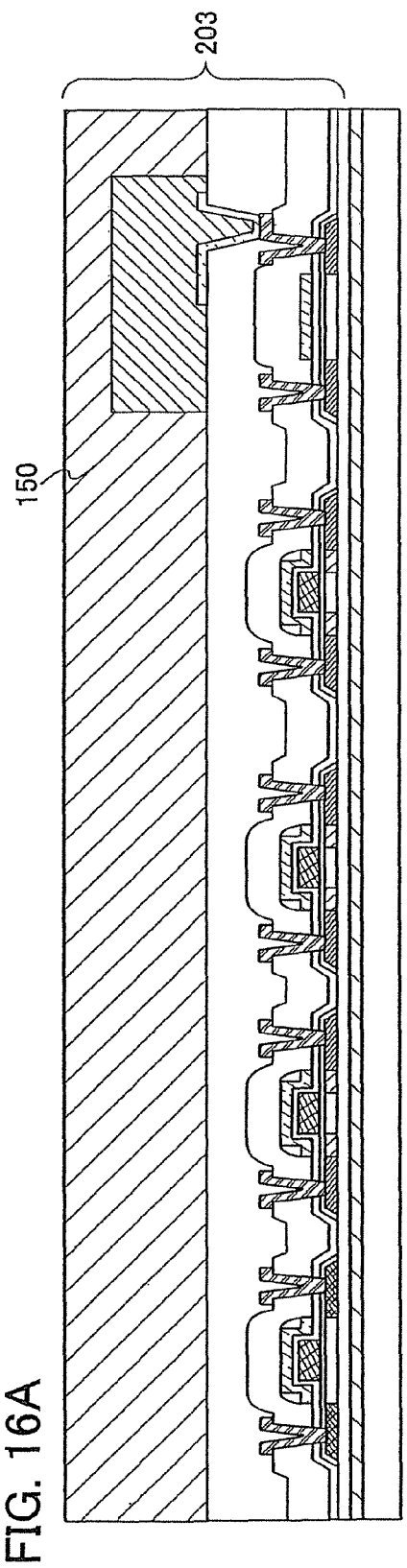
FIGS. 16A and 16B are diagrams illustrating a manufacturing process of an ID chip.

Next, an insulating film 150 functioning as a protective film is formed by an SOG method, a droplet discharge method, or the like so as to cover the logic circuit portion, the semiconductor memory portion, and the conductive film 147 functioning as an antenna (FIG. 16A). The insulating film 150 is formed from a film containing carbon such as DLC (Diamond Like Carbon), a film containing silicon nitride, a film containing silicon nitride oxide, or an organic material, or preferably formed of an epoxy resin.

Figure 16B:
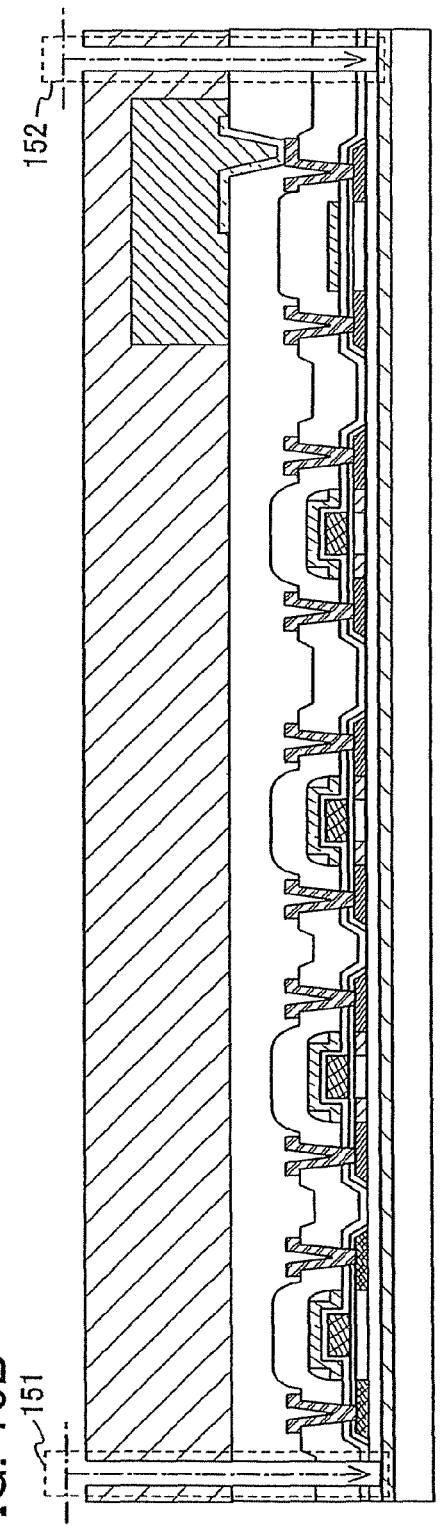
Figure 17A:
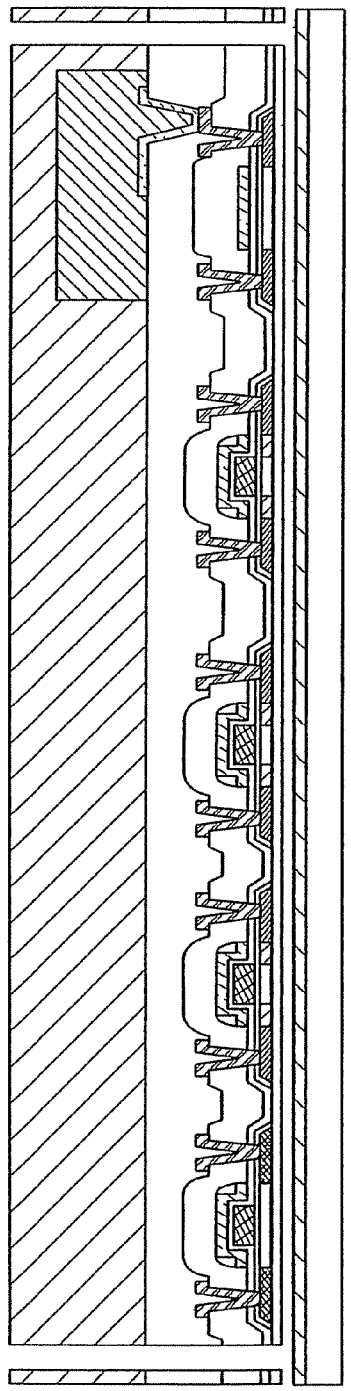
FIGS. 17A and 17B are diagrams illustrating a manufacturing process of an ID chip.

Next, a layer 203 including the insulating film 102 functioning as a base film, the semiconductor memory device, the thin film transistor, and the like (hereinafter referred to as a "layer 203") is peeled from the substrate 100. Here, openings 151 and 152 are formed by being irradiated with a laser beam (e.g. UV light) (FIG. 16B), and then, the layer 203 can be peeled from the substrate 100 by using physical power (FIG. 17A). Alternatively, before the layer 203 is peeled from the substrate 100, an etchant may be introduced into the openings 151 and 152 to remove the release layer 101. As the etchant, a gas or a liquid containing halogen fluoride or an interhalogen compound is used; for example, chlorine trifluoride ($ClF_3$) is used as a gas containing halogen fluoride. Accordingly, the layer 203 is peeled from the substrate 100. Note that the release layer 101 may be partially left instead of being removed entirely. By leaving a part of the release layer 101, consumption of the etchant can be reduced and time for removing the release layer can be shortened. In addition, the layer 203 can be retained over the substrate 100 even after the release layer 101 is removed. Further, it is preferable to reuse the substrate 101 after the layer 203 is peeled off for cost reduction.

Figure 17B:
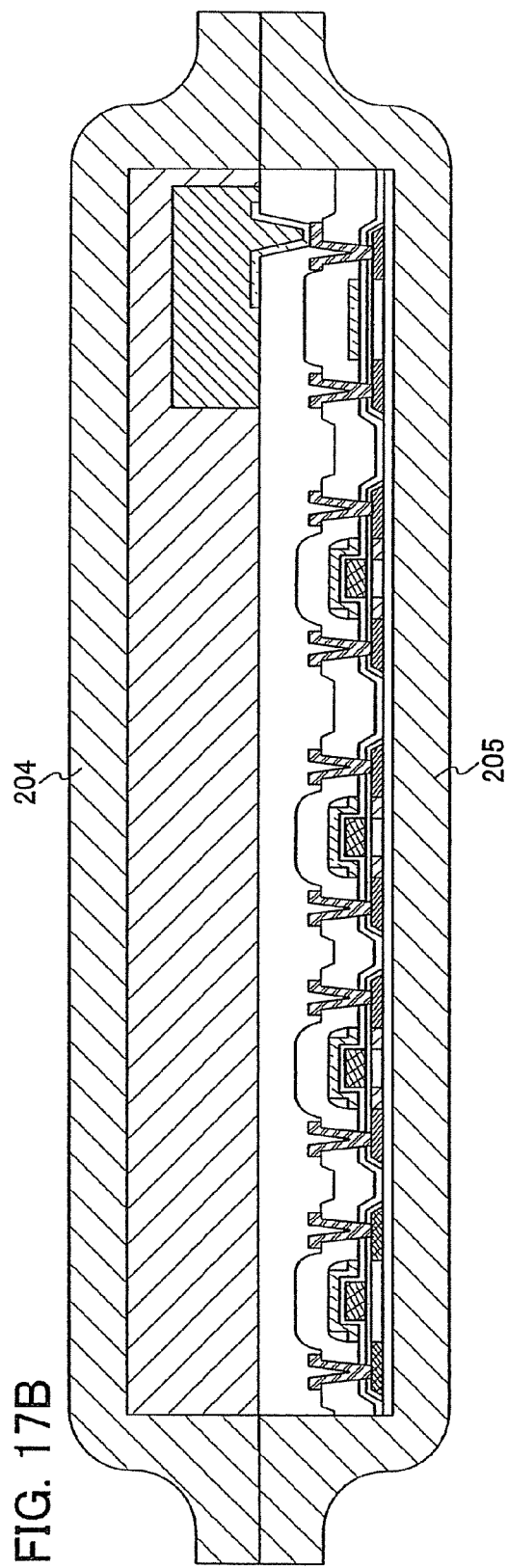

Next, one surface of the layer 203 is attached to a first base 204, and then the layer 203 is completely peeled from the substrate 100. Subsequently, the other surface of the layer 203 is attached to a second base 205, and then one or both of heat treatment and pressure treatment are performed to seal the layer 203 with the first base 204 and the second base 205 (FIG. 17B). As the first base 204 and the second base 205, a film formed of polypropylene, polyester, vinyl, polyvinyl fluoride, polyvinyl chloride, or the like, paper of a fibrous material, a stacked-layer film of a base film (polyester, polyamide, an inorganic vapor deposition film, paper, or the like) and an adhesive synthetic resin film (acrylic-based synthetic resin, epoxy-based synthetic resin, or the like), or the like can be used.

The film is attached to an object to be processed by performing heat treatment and pressure treatment, and the treatments are performed in the following manner: an adhesive layer which is provided on the outermost surface of the film or a layer (not an adhesive layer) which is provided on the outermost layer thereof is melted by the heat treatment, and then pressure is applied, thereby the film is attached. An adhesive layer may be provided on a surface of the first base 204 and the second base 205, but is not necessarily provided. The adhesive layer corresponds to a layer containing an adhesive such as a heat curable resin, an ultraviolet-curable resin, an epoxy resin-based adhesive or a resin additive.

Through the above steps, a semiconductor device having a memory element portion and an antenna can be manufactured. A semiconductor device of this embodiment mode is capable of exchanging data without contact. Further, through the above steps, a flexible semiconductor device can be obtained. Note that this embodiment mode can be implemented freely combining with the aforementioned embodiment modes.

(Embodiment Mode 6)

An application of the semiconductor device which can exchange data without contact is described below with reference to the drawings. The semiconductor device capable of exchanging data without contact is also referred to as an RFID (Radio Frequency Identification), an ID tag, an IC tag, an IC chip, an RF (Radio Frequency) tag, a wireless tag, an electronic tag, or a wireless chip depending on a usage pattern.

Figure 18A:
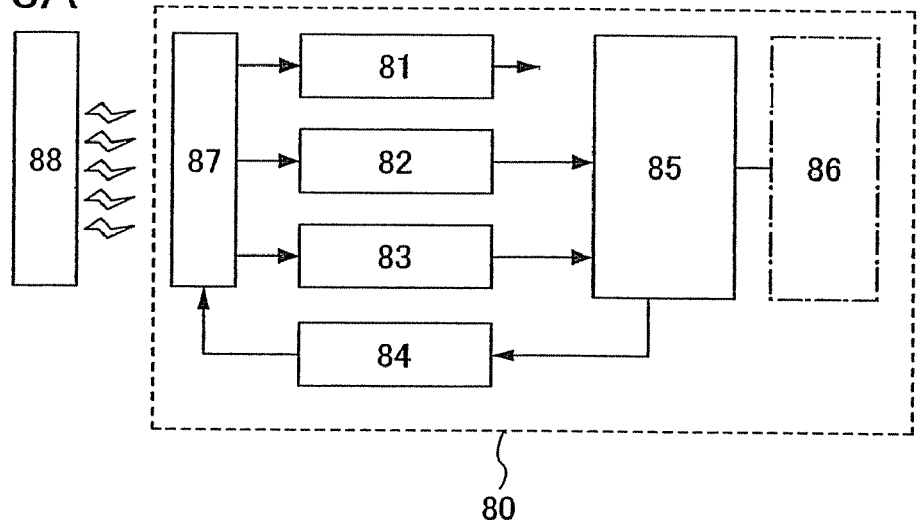
FIGS. 18A to 18C are diagrams each showing an application of an ID chip.

An RFID 80 has a function of exchanging data without contact, and includes a power supply circuit 81, a clock generation circuit 82, a data demodulation circuit 83, a data modulation circuit 84, a control circuit 85 for controlling other circuits, a memory circuit 86, and an antenna 87 (FIG. 18A). Note that the number of memory circuits is not limited to one, and a plurality of memory circuits may be provided. As the memory circuit, an SRAM, a flash memory, an EEPROM, a ROM, an FeRAM or the like, or a memory having a memory element portion formed of the organic compound layer may be used.

A signal transmitted as an electromagnetic wave from a reader/writer 88 is converted into an AC electrical signal in an antenna 87 by electromagnetic induction. In the power supply circuit 81, a power supply voltage is generated using an AC electrical signal, and the power supply voltage is supplied to each circuit using a power supply wire. In the clock generation circuit 82, various clock signals are generated based on an AC signal inputted from the antenna 87, and the signals are supplied to the control circuit 85. In the data demodulation circuit 83, the AC electrical signal is demodulated and supplied to the control circuit 85. In the control circuit 85, various arithmetic operations are performed in accordance with the inputted signals. The memory circuit 86 stores programs, data and the like that are used in the control circuit 85, and functions as a work area for arithmetic operations. Then, data is transmitted from the control circuit 85 to the data modulation circuit 84, and load modulation of the antenna 87 can be achieved by means of the data transmitted from the data modulation circuit 84. The reader/writer 88 receives load modulation of the antenna 87 as electromagnetic waves, thereby reading data.

In addition, the RFID may be a type of supplying a power supply voltage to each circuit by an electric wave, without mounting a power source (battery), or may be a type of supplying a power supply voltage to each circuit by an electric wave and a power source (battery), mounting a power source (battery).

With the structure described in the aforementioned embodiment modes, a flexible RFID can be manufactured. Thus, such an RFID can be attached to an object having a curved surface.

Figure 18B:
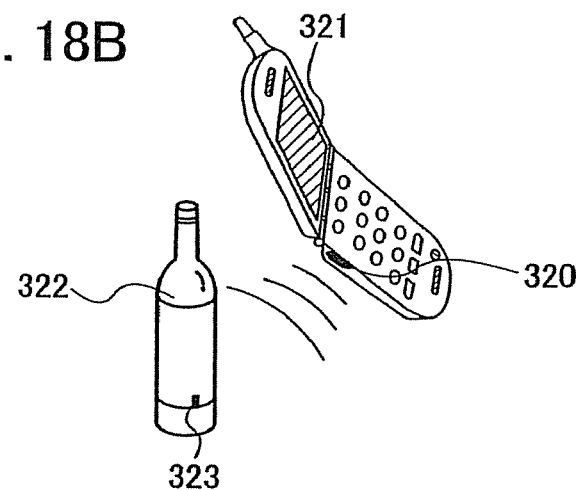
Figure 18C:
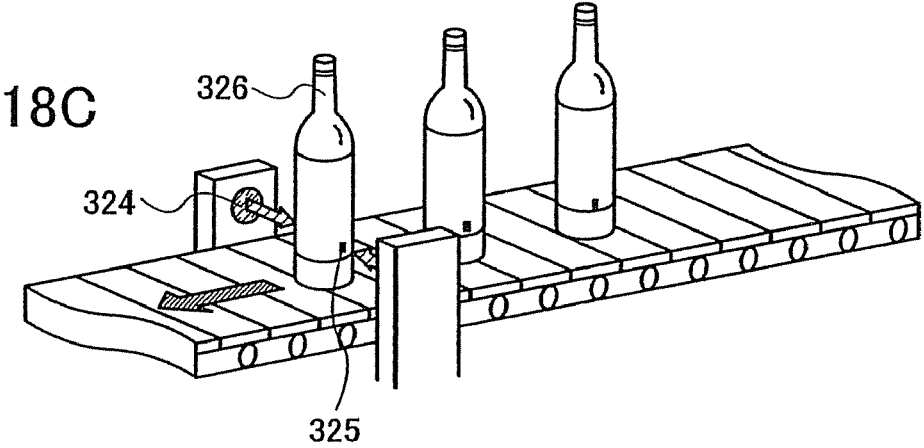
Figure 19A:
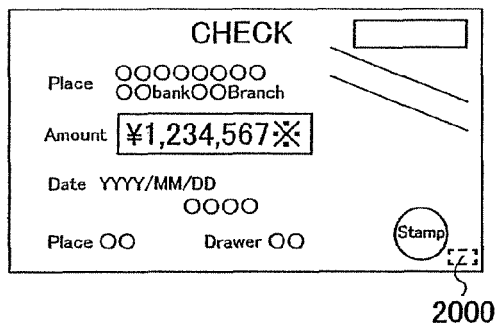
FIGS. 19A to 19H are diagrams each showing an application of an ID chip.
Figure 19B:
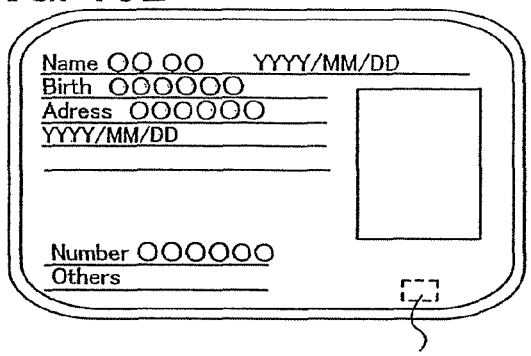
Figure 19C:
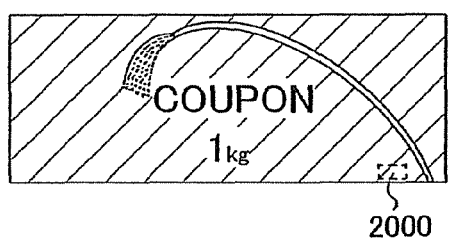
Figure 19D:
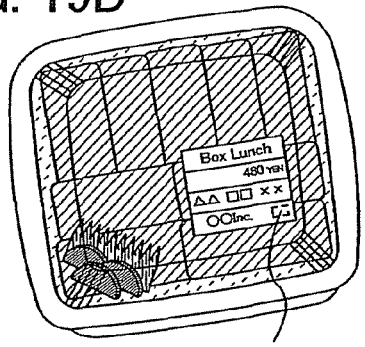
Figure 19E:
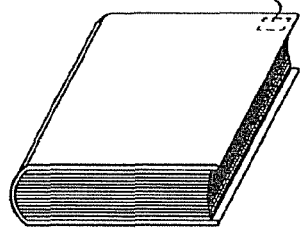
Figure 19F:
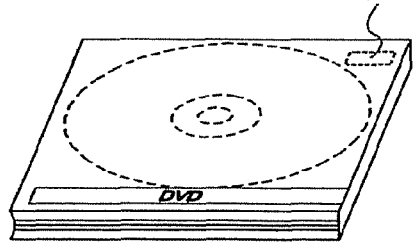
Figure 19G:
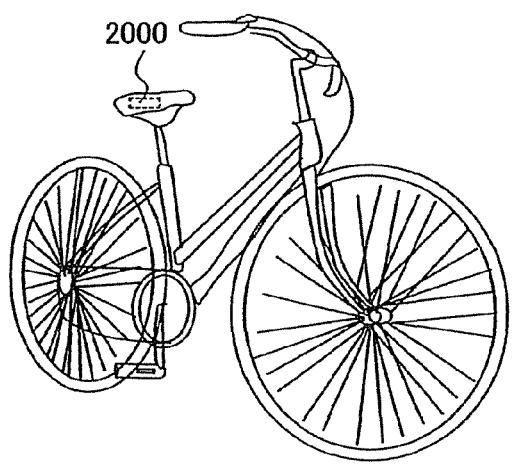
Figure 19H:
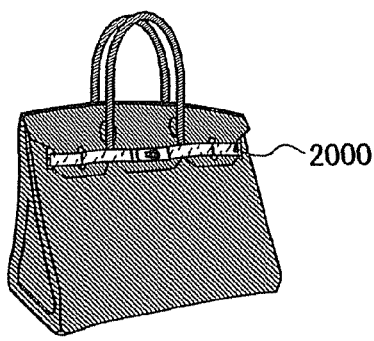

Next, one example of a usage pattern of a flexible RFID is described. A reader/writer 320 is provided on a side of a portable terminal including a display portion 321, and an RFID 323 is provided on a side of an article 322 (FIG. 18B). When the reader/writer 320 is held toward the RFID 323 included in the article 322, information relating to a product, such as a raw material and a place of origin of the article, a test result in each production process, a history of distribution process, or further, description of the product is displayed on the display portion 321. In addition, a product 326 can be inspected by using a reader/writer 324 and an RFID 325 provided for the product 326 during the product 326 is conveyed by a belt conveyor (FIG. 18C). In this manner, information can be easily obtained, and high functions and high added values are realized by utilizing an RFID for a system. Further, as described in the aforementioned embodiment modes, even when an RFID is attached to an object having a curved surface, a transistor or the like included in the RFID can be prevented from being damaged, so that a highly reliable RFID can be provided.

In addition to the above, the application range of a flexible RFID is so wide that it may be applied to any product by which the history of an object is clarified without contact and utilized in production, management and the like. For example, the RFID may be provided for bills, coins, securities, certificates, bearer bonds, containers for packages, books, recording media, personal belongings, vehicles, foods, clothes, healthcare items, lifestyle goods, medicals, electronic apparatuses, and the like. Examples thereof are described with reference to FIGS. 19A to 19H.

The bills and coins include currency in the market and include a note that is in currency in a specific area as money (cash voucher), memorial coins, and the like. The securities include a check, a certificate, a promissory note, and the like (see FIG. 19A). The certificates include a driving license, a resident card, and the like (see FIG. 19B). The bearer bonds include a stamp, a rice coupon, various gift coupons, and the like (see FIG. 19C). The containers for packages include paper for packing a box lunch or the like, a plastic bottle, and the like (see FIG. 19D). The books include a document and the like (see FIG. 19E). The recording media include DVD software, a video tape, and the like (see FIG. 19F). The vehicles include a wheeled vehicle such as a bicycle, a vessel, and the like (see FIG. 19G). The personal belongings include a bag, glasses, and the like (see FIG. 19H). The foods include food items, beverages, and the like. The clothes include clothing, footwear, and the like. The healthcare items include a medical device, a health appliance, and the like. The lifestyle goods include furniture, a lighting apparatus, and the like. The medicals include a medicine, an agricultural chemical, and the like. The electronic apparatuses include a liquid crystal display device, an EL display device, a television set (television receiver or thin television receiver), a mobile phone device, and the like.

When an RFID 2000 is provided for bills, coins, securities, certificates, bearer bonds, and the like, forgery of them can be prevented. When the RFID is provided for containers for packages, books, recording media, personal belongings, foods, lifestyle goods, electronic apparatuses, and the like, inspection systems, rental systems and the like can be performed more efficiently. When the RFID is provided for vehicles, healthcare items, medicals, and the like, forgery and theft of them can be prevented and medicines can be prevented from being consumed in the wrong manner. An RFID may be attached to a surface of a product or incorporated into a product. For example, an RFID may be incorporated into the paper of a book, or an organic resin of a package. By using a flexible RFID, damage or the like to an element included in the RFID can be prevented even when the RFID, in which a semiconductor device having such a structure described in the aforementioned embodiment modes is used, is provided for paper or the like.

In this manner, when the RFID is provided for containers for packages, recording media, personal belongings, foods, clothes, lifestyle goods, electronic apparatuses, and the like, inspection system, rental system and the like can be performed more efficiently. The RFID also prevents vehicles from being forged or stolen. In addition, when the RFID is implanted into creatures such as animals, each creature can be identified easily. For example, when the RFID provided with a sensor is implanted into creatures such as domestic animals, not only the year of birth, sex, breed and the like but also the health condition such as the current body temperature can be easily controlled.

Note that this embodiment mode can be implemented freely combining with the aforementioned embodiment modes. That is, all of the structures described in this embodiment mode and the aforementioned embodiment modes which are freely combined are included in the present invention.

(Embodiment Mode 7)

A semiconductor device of the present invention can be used for a known NOR type memory device or a NAND type memory device.

Figure 20A:
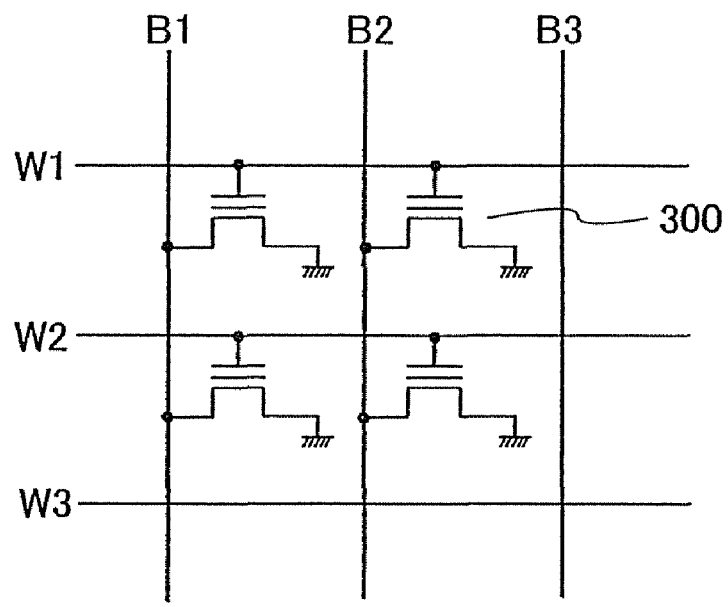
FIGS. 20A and 20B are diagrams illustrating a NOR-type memory device.

FIG. 20A shows a NOR type memory device having one semiconductor memory device per cell. Reference symbols W1, W2, and W3 denote word lines, and B1, B2, and B3 denote bit lines. A semiconductor device 300 of the present invention is provided between each bit line and each ground line. The word line is electrically connected to a control gate electrode of the semiconductor device 300.

Figure 20B:
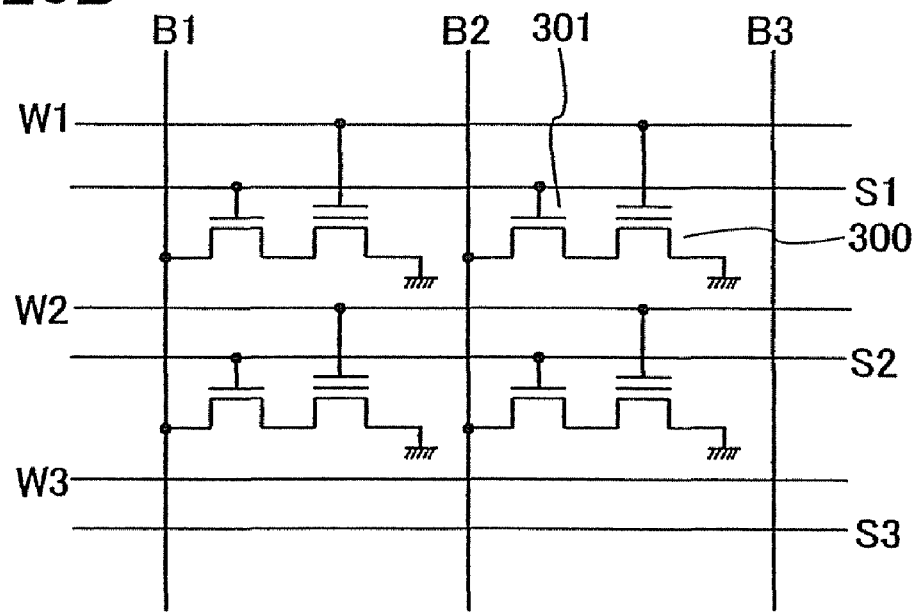

FIG. 20B shows a NOR type memory device having a selecting thin film transistor and a semiconductor memory device per cell. Reference symbols W1, W2, and W3 denote word lines, B1, B2, and B3 denote bit lines, and S1, S2, and S3 denote select lines. A semiconductor device 300 and a selecting thin film transistor 301 of the present invention are provided between each bit line and each ground line.

A gate electrode of the selecting thin film transistor 301 is electrically connected to the select line. The selecting thin film transistor 301 electrically connects the bit line to the semiconductor device 300 of the present invention. Although the structure of the selecting thin film transistor 301 is not limited particularly, the thin film transistor described in the aforementioned embodiment modes can be used for example.

Figure 21:
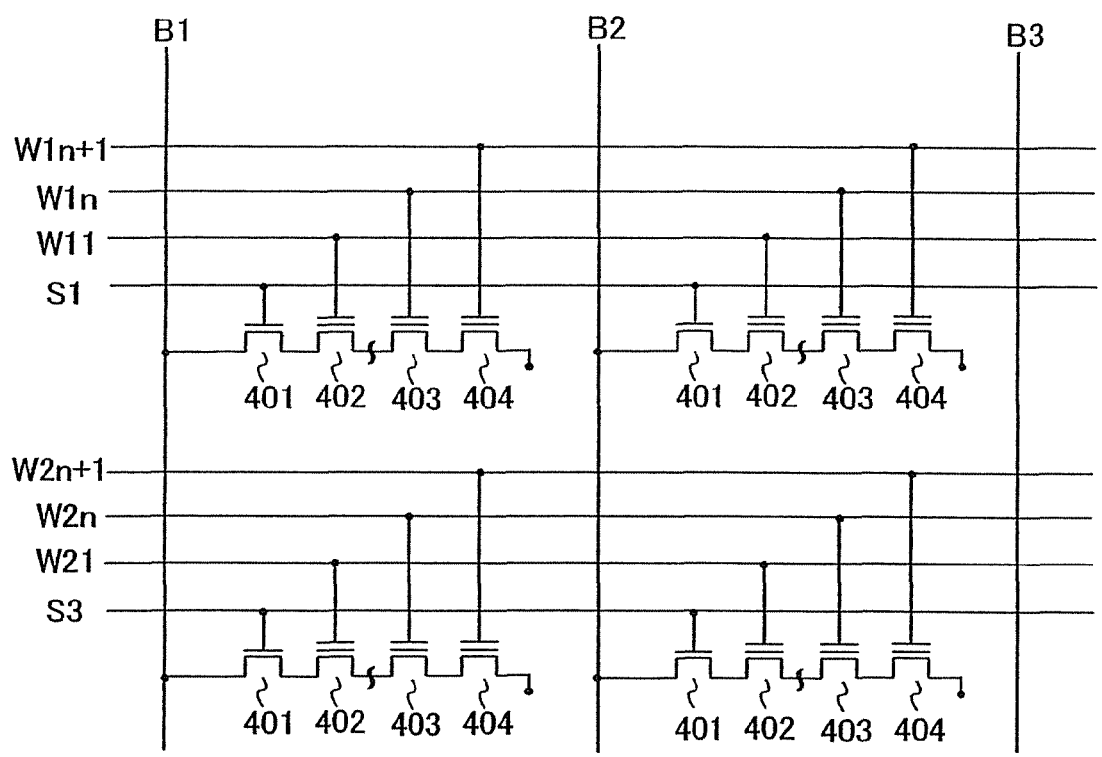
FIG. 21 is a diagram illustrating a NAND-type memory device.
Figure 22:
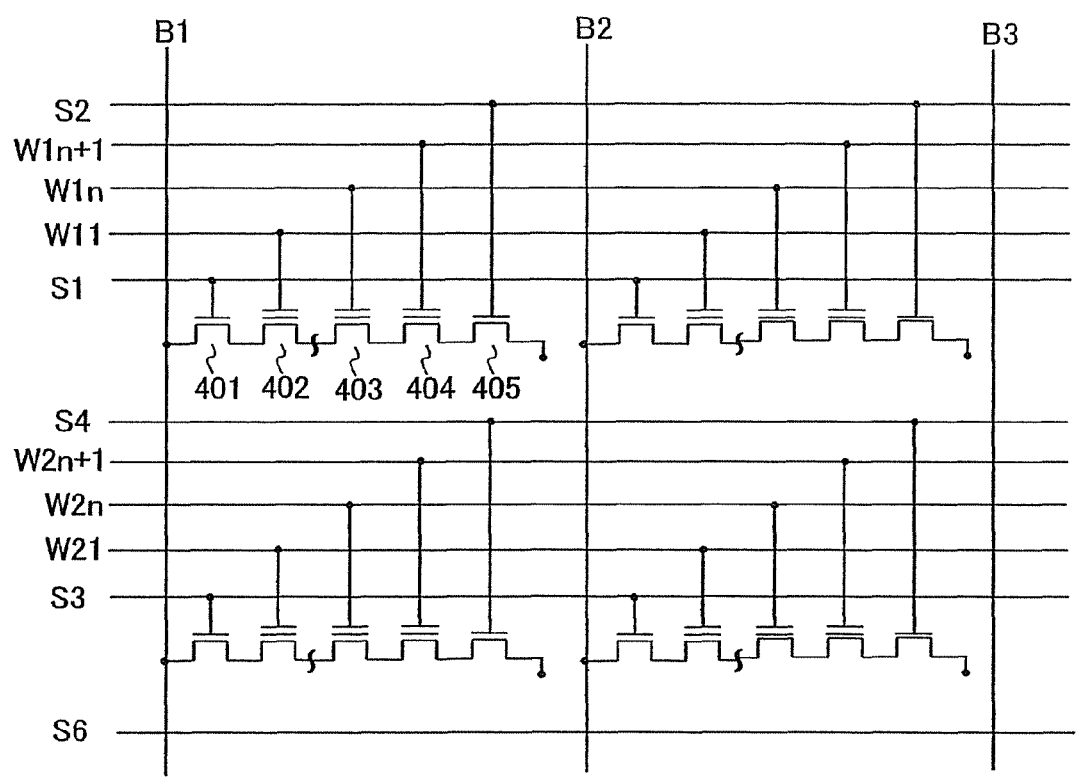
FIG. 22 is a diagram illustrating a NAND-type memory device.

FIGS. 21 and 22 each show a NAND type memory device. FIG. 21 shows a NAND type memory device with one selecting transistor. FIG. 22 shows a NAND type memory device with two selecting transistors.

In FIG. 21, reference numeral 401 is a selecting thin film transistor and a gate electrode thereof is electrically connected to a select line S1. The selecting thin film transistor 401 electrically connects a bit line denoted by B1 (or B2) to semiconductor devices 402 to 404 of the present invention. Although a structure of the selecting thin film transistor 401 is not limited particularly, the thin film transistor described in the aforementioned embodiment modes can be used for example.

The semiconductor devices 402 to 404 are connected in series. The number of semiconductor devices is not limited particularly. One terminal of the semiconductor device 404 of the last stage is electrically connected to a power supply line or the like, or may be connected to ground of course.

In addition, a selecting thin film transistor 405 may be connected to the semiconductor device 404 of the last stage (FIG. 22). One terminal of the selecting thin film transistor 405 is electrically connected to a power supply line or the like, or may be connected to ground of course. A gate electrode of the selecting thin film transistor 405 is electrically connected to a select line S2. A structure of the selecting thin film transistor 405 is not limited similarly to the selecting thin film transistor 401.

It goes without saying that the semiconductor device of the present invention is applicable to a structure of a memory device other than that described here.

(Embodiment 1)

An example in which a control gate electrode is actually formed by the manufacturing method of the semiconductor device described in Embodiment Mode 3 is described with reference to FIGS. 23A and 23B.

Figure 23A:
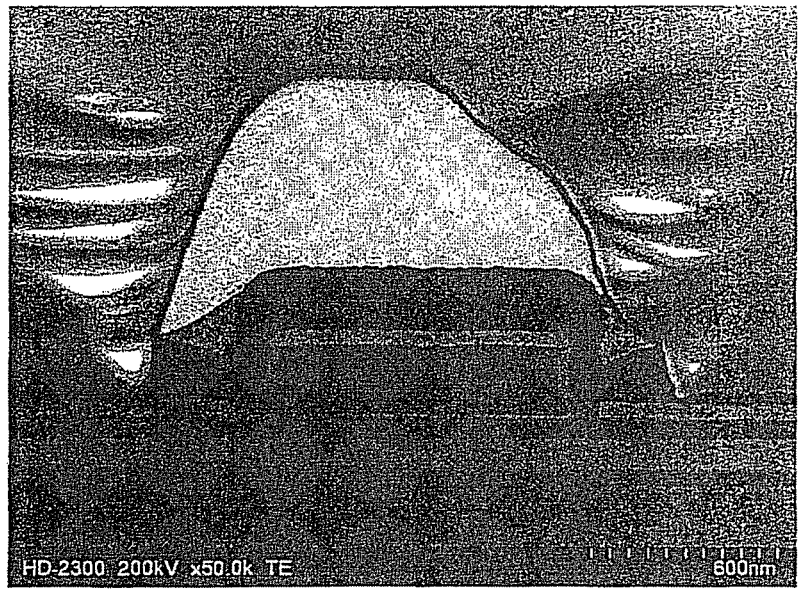
FIGS. 23A and 23B are a cross-sectional photograph and a cross-sectional view respectively in a manufacturing process of a semiconductor device according to the present invention.
Figure 23B:
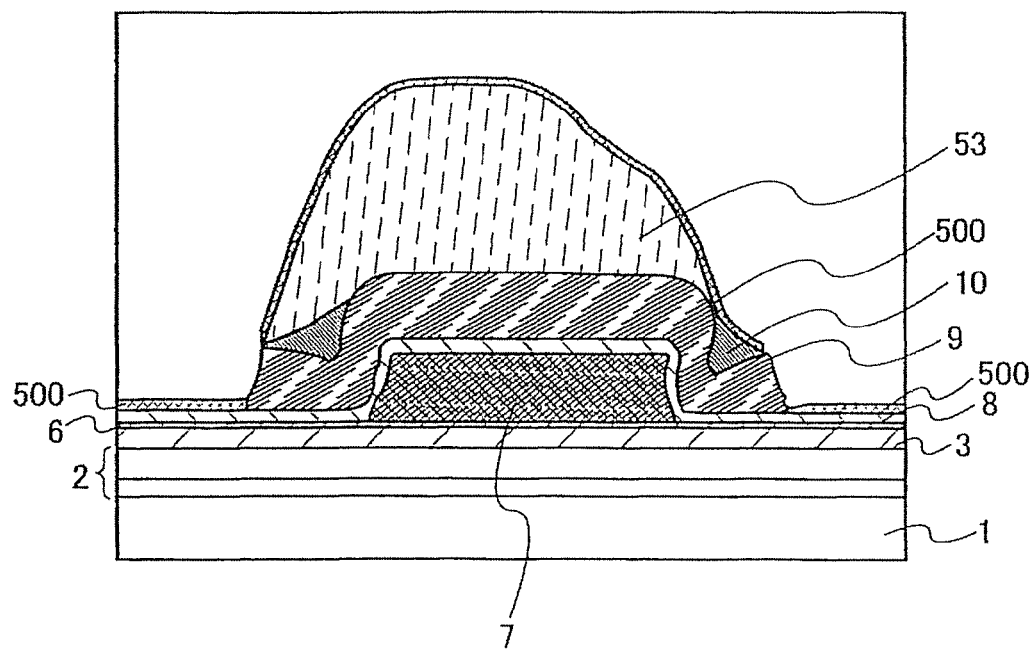

FIG. 23A is an example of a sectional photograph observed by a scanning transmission electron microscopy (STEM), and FIG. 23B is a schematic diagram showing the photograph of FIG. 23A. Note that the same portions as those described in the aforementioned embodiment modes are denoted by the same reference numerals.

Here, a base insulating film 2 structured by a stacked-layer film of a silicon nitride oxide film with a thickness of 50 nm and a silicon oxynitride film with a thickness of 100 nm is formed over a glass substrate 1. A semiconductor film 3 formed of silicon is formed with a thickness of 60 nm over the base insulating film 2. A first gate insulating film 6 of a silicon oxynitride film is formed with a thickness of 10 nm over the semiconductor film 3. A floating gate electrode 7 formed of tungsten is formed with a thickness of 200 nm over the first gate insulating film 6. A second gate insulating film 8 of a silicon oxynitride film is formed with a thickness of 60 nm to cover the floating gate electrode 7. A control gate electrode 9 structured by a stacked-layer film of tantalum nitride with a thickness of 30 nm and tungsten with a thickness of 170 nm is formed over the second gate insulating film 8. Sidewalls 10 of a silicon oxynitride film are formed on a stepped potions of the control gate electrode 9. The resist mask 53 remains over the control gate electrode 9 and an upper portion of the sidewall 10 without being removed. Note that a layer 500 formed of a conductive material is formed in order to manufacture a sample to be observed by the STEM. Note that the layer 500 formed of a conductive material is formed using Pt (platinum).

By using such a structure, a semiconductor device having excellent retention properties can be formed without generating a leak between a control gate electrode and a floating gate electrode. Further, by using the present invention, a control gate electrode can be formed at a desired position in a self-aligned manner without generating misalignment when forming a pattern.

This application is based on Japanese Patent Application serial No. 2005-373010 filed in Japan Patent Office on Dec. 26, 2005, the entire contents of which are hereby incorporated by reference.

What is claimed is:

1. A method of manufacturing a semiconductor device comprising:
    forming a first gate insulating film over a semiconductor;
    forming a floating gate electrode over the first gate insulating film;
    forming a second gate insulating film so as to cover the floating gate electrode;
    forming a conductive film over the second gate insulating film;
    forming a film over the conductive film;
    subjecting the film to etching to form a sidewall on a stepped portion which is generated in the conductive film due to the floating gate electrode;
    forming a mask over an upper step portion of the stepped portion over the conductive film; and
    etching the conductive film by using the mask and the sidewall to form a control gate electrode.

2. The method of manufacturing a semiconductor device according to claim 1,
    wherein the mask is formed so as not to extend beyond an outer side edge of the sidewall.

3. The method of manufacturing a semiconductor device according to claim 1,
    wherein n-type or p-type impurities are added to the semiconductor by using the floating gate electrode as a mask, so that a channel forming region, a source region, and a drain region are formed in the semiconductor.

4. The method of manufacturing a semiconductor device according to claim 3,
    wherein the control gate electrode is overlapped with the source region and the drain region with the first gate insulating film and the second gate insulating film interposed therebetween, and
    wherein a length of a gate length direction in a region in which the control gate electrode and one of the source region and the drain region overlap each other is equal to or almost equal to a length of a gate length direction in a region in which the control gate electrode and the other of the source region and the drain region overlap each other.

5. The method of manufacturing a semiconductor device according to claim 3,
    wherein the control gate electrode is overlapped with the source region and the drain region with the first gate insulating film and the second gate insulating film interposed therebetween, and
    wherein an area of a region in which the control gate electrode and one of the source region and the drain region overlap each other is equal to or almost equal to an area of a region in which the control gate electrode and the other of the source region and the drain region overlap each other.

6. The method of manufacturing a semiconductor device according to claim 1,
    wherein n-type or p-type impurities are added to the semiconductor by using the floating gate electrode as a mask, and the same conductive impurities as the n-type or p-type impurities are added to the semiconductor by using the control gate electrode as a mask, so that a channel forming region, a pair of first impurity regions, and a pair of second impurity regions are formed in the semiconductor, and
    wherein the pair of second impurity regions are formed in a region overlapped with the control gate electrode with the first gate insulating film and the second gate insulating film interposed therebetween.

7. The method of manufacturing a semiconductor device according to claim 6,
    wherein a length of a gate length direction in a region in which the control gate electrode and one of the pair of second impurity regions overlap each other is equal to or almost equal to a length of a gate length direction in a region in which the control gate electrode and the other of the pair of second impurity regions overlap each other.

8. The method of manufacturing a semiconductor device according to claim 6,
    wherein an area of a region in which the control gate electrode and one of the pair of second impurity regions overlap each other is equal to or almost equal to an area of a region in which the control gate electrode and the other of the pair of second impurity regions overlap each other.

9. The method of manufacturing a semiconductor device according to claim 1, wherein the semiconductor is a crystalline semiconductor film formed on an insulating surface.

10. A method of manufacturing a semiconductor device comprising:
    forming a first gate insulating film over a semiconductor;
    forming a first conductive film over the first gate insulating film;
    forming a second conductive film over the first conductive film;
    forming a first mask over the second conductive film;
    performing a first etching by using the first mask, to make the first conductive film a first floating gate electrode and make the second conductive film a third conductive film;

performing a second etching in which a side of the third conductive film is etched, to form a second floating gate electrode which has a shorter gate length than that of the first floating gate electrode, so that a floating gate electrode comprising the first floating gate electrode and the second floating gate electrode is formed;

forming a second gate insulating film so as to cover the floating gate electrode;

forming a conductive film over the second gate insulating film;

forming a film over the conductive film;

subjecting the film to etching to form a sidewall on a stepped portion which is generated in the conductive film due to the floating gate electrode;

forming a second mask over an upper step portion of the stepped portion over the conductive film; and etching the conductive film by using the second mask and the sidewall to form a control gate electrode.

11. The method of manufacturing a semiconductor device according to claim 10,
wherein the second mask is formed so as not to extend beyond an outer side edge of the sidewall.

12. The method of manufacturing a semiconductor device according to claim 10,
wherein n-type or p-type impurities are added to the semiconductor by using the floating gate electrode as a mask, so that a channel forming region, a pair of LDD regions, a source region and a drain region are formed in the semiconductor.

13. The method of manufacturing a semiconductor device according to claim 12,
wherein the control gate electrode is overlapped with the pair of LDD regions with the first gate insulating film and the second gate insulating film interposed therebetween, and
wherein a length of a gate length direction in a region in which the control gate electrode and one of the pair of LDD regions overlap each other is equal to or almost equal to a length of a gate length direction in a region in which the control gate electrode and the other of the pair of LDD regions overlap each other.

14. The method of manufacturing a semiconductor device according to claim 12,
wherein the control gate electrode is overlapped with the pair of LDD regions with the first gate insulating film and the second gate insulating film interposed therebetween, and
wherein an area of a region in which the control gate electrode and one of the pair of LDD regions overlap each other is equal to or almost equal to an area of a region in which the control gate electrode and the other of the pair of LDD regions overlap each other.

15. The method of manufacturing a semiconductor device according to claim 10,
wherein n-type or p-type impurities are added to the semiconductor by using the floating gate electrode as a mask, and the same conductive impurities as the n-type or p-type impurities are added to the semiconductor by using the control gate electrode as a mask, to form a channel forming region, a pair of first impurity regions, a pair of second impurity regions, and a pair of third impurity regions in the semiconductor,
wherein each of the pair of second impurity regions is formed between one of the pair of third impurity regions and the channel forming region,
wherein each of the pair of third impurity regions is formed between one of the first impurity regions and one of the pair of second impurity regions, and
wherein the pair of third impurity regions are formed in a region overlapped with the control gate electrode with the first gate insulating film interposed therebetween.

16. The method of manufacturing a semiconductor device according to claim 15,
wherein a length of a gate length direction in a region in which the control gate electrode and one of the pair of third impurity regions overlap each other is equal to or almost equal to a length of a gate length direction in a region in which the control gate electrode and the other of the pair of third impurity regions overlap each other.

17. The method of manufacturing a semiconductor device according to claim 15,
wherein an area of a region in which the control gate electrode and one of the pair of third impurity regions overlap each other is equal to or almost equal to an area of a region in which the control gate electrode and the other of the pair of third impurity regions overlap each other.

18. The method of manufacturing a semiconductor device according to claim 10, wherein the semiconductor is a crystalline semiconductor film formed on an insulating surface.

* * * * *

UNITED STATES PATENT AND TRADEMARK OFFICE
CERTIFICATE OF CORRECTION

PATENT NO. : 8,252,643 B2  Page 1 of 1
APPLICATION NO. : 13/163927
DATED : August 28, 2012
INVENTOR(S) : Yoshinobu Asami It is certified that error appears in the above-identified patent and that said Letters Patent is hereby corrected as shown below:

In the Specification:

Column 4, Line 49; Change "a regions" to --a region--.

Column 16, Line 46; Change "bather layer 44" to --barrier layer 44--.

Column 20, Line 43; Change "aluminum (AI)," to --aluminum (Al),--.

Column 20, Line 46; Change "there am" to --there are--.

In the Claims:

Column 33, Line 32, Claim 13; Change "first gate insulating fihn" to --first gate insulating film--.

Signed and Sealed this
Eighteenth Day of December, 2012

David J. Kappos
*Director of the United States Patent and Trademark Office*